United States Patent
Shannon et al.

(10) Patent No.: US 11,533,817 B2
(45) Date of Patent: Dec. 20, 2022

(54) TEXTURED GLASS COMPONENT FOR AN ELECTRONIC DEVICE ENCLOSURE

(71) Applicant: Apple Inc., Cupertino, CA (US)

(72) Inventors: Jason P. Shannon, Sunnyvale, CA (US); Andi M. Limarga, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/403,364

(22) Filed: Aug. 16, 2021

(65) Prior Publication Data

US 2021/0378117 A1 Dec. 2, 2021

Related U.S. Application Data

(63) Continuation of application No. 16/564,325, filed on Sep. 9, 2019, now Pat. No. 11,109,500.
(Continued)

(51) Int. Cl.
*H05K 5/03* (2006.01)
*C03C 15/00* (2006.01)
(Continued)

(52) U.S. Cl.
CPC ............ *H05K 5/03* (2013.01); *C03C 15/00* (2013.01); *C03C 19/00* (2013.01); *C03C 21/002* (2013.01);
(Continued)

(58) Field of Classification Search
CPC ....... C03C 15/00; C03C 19/00; G06F 1/1626; G06F 1/1656; G06F 1/1686;
(Continued)

(56) References Cited

U.S. PATENT DOCUMENTS

| 4,633,323 A | 12/1986 | Haberkern et al. |
| 5,476,821 A | 12/1995 | Beall et al. |

(Continued)

FOREIGN PATENT DOCUMENTS

| CN | 101712102 | 5/2010 |
| CN | 203013800 | 6/2013 |

(Continued)

OTHER PUBLICATIONS

Author Unknown, "LG's Future Display Technology Will Blow You Away," Techno Source, https://www.youtube.com/watch?v=qlRjytgNuhM, 2 pages, May 2, 2017.

(Continued)

*Primary Examiner* — David Bilodeau
(74) *Attorney, Agent, or Firm* — Brownste Hyatt Farber Schreck, LLP

(57) ABSTRACT

The disclosure provides textured glass components as well as electronic device cover assemblies and enclosures which include the textured glass components. In some cases, a protruding portion of the glass component includes a textured region provided over a camera assembly of the electronic device. One or more openings may be provided in the textured region. The textured region may be configured to provide a translucent or hazy appearance to the electronic device while providing a desirable "feel" to the electronic device and level of cleanability.

20 Claims, 10 Drawing Sheets

Related U.S. Application Data

(60) Provisional application No. 62/857,613, filed on Jun. 5, 2019.

(51) Int. Cl.

| | |
|---|---|
| *C03C 19/00* | (2006.01) |
| *C03C 21/00* | (2006.01) |
| *G06F 1/16* | (2006.01) |
| *H04M 1/02* | (2006.01) |
| *H04N 5/225* | (2006.01) |
| *H05K 5/00* | (2006.01) |
| *H04B 1/3827* | (2015.01) |

(52) U.S. Cl.
CPC .......... *G06F 1/1626* (2013.01); *G06F 1/1686* (2013.01); *H04M 1/0264* (2013.01); *H04N 5/2252* (2013.01); *H04N 5/2253* (2013.01); *H04N 5/2257* (2013.01); *H05K 5/0017* (2013.01); *H04B 1/3827* (2013.01)

(58) Field of Classification Search
CPC . H04M 1/0264; H04N 5/2252; H04N 5/2253; H04N 5/2257; H05K 5/0017; H05K 5/03
See application file for complete search history.

(56) References Cited

U.S. PATENT DOCUMENTS

| | | | |
|---|---|---|---|
| 6,068,891 A | 5/2000 | O'Dell et al. |
| 6,677,703 B2 | 1/2004 | Ito et al. |
| 7,297,386 B2 | 11/2007 | Suzuki et al. |
| 7,646,143 B2 | 1/2010 | Kimura et al. |
| 8,092,911 B2 | 1/2012 | Sakoske et al. |
| 8,106,787 B2 | 1/2012 | Nurmi |
| 8,184,373 B2 | 5/2012 | Tanaka et al. |
| 8,213,085 B2 | 7/2012 | Liu et al. |
| 8,553,333 B2 | 10/2013 | Chang et al. |
| 8,576,561 B2 | 11/2013 | Myers et al. |
| 8,603,372 B2 | 12/2013 | Tanaka et al. |
| 8,681,113 B1 | 3/2014 | Wu et al. |
| 8,771,532 B2 | 7/2014 | Carlson et al. |
| 8,872,295 B2 | 10/2014 | Hermans et al. |
| 8,896,802 B2 | 11/2014 | Yoneyama et al. |
| 8,953,083 B2 | 2/2015 | Hedge |
| 9,017,566 B2 | 4/2015 | Lander et al. |
| 9,034,166 B2 | 5/2015 | Tatebe et al. |
| 9,154,678 B2 | 10/2015 | Kwong et al. |
| 9,239,594 B2 | 1/2016 | Lee et al. |
| 9,240,498 B2 | 1/2016 | Fujita et al. |
| 9,262,002 B2 | 2/2016 | Momeyer et al. |
| 9,377,603 B1 | 6/2016 | Cheng et al. |
| 9,448,713 B2 | 9/2016 | Cruz-Hernandez et al. |
| 9,554,482 B2 | 1/2017 | Wilson et al. |
| 9,644,281 B2 | 5/2017 | Tatebe et al. |
| 9,658,500 B2 | 5/2017 | Iwamoto |
| 9,720,141 B1 | 8/2017 | Cheng et al. |
| 9,732,237 B2 | 8/2017 | Sugamoto et al. |
| 9,745,221 B2 | 8/2017 | Ehrensperger et al. |
| 9,862,124 B2 | 1/2018 | Radcliffe et al. |
| 9,880,327 B2 | 1/2018 | Park et al. |
| 9,938,186 B2 | 4/2018 | Moll et al. |
| 9,961,337 B2 | 5/2018 | Stroetmann |
| 10,013,020 B2 | 7/2018 | Hong et al. |
| 10,043,052 B2 | 8/2018 | Wickboldt et al. |
| 10,101,583 B2 | 10/2018 | Saenger Nayver et al. |
| 10,171,636 B2 | 1/2019 | Yeo et al. |
| 10,214,445 B2 | 2/2019 | Hart et al. |
| 10,298,824 B2 | 5/2019 | Lee et al. |
| 10,442,151 B2 | 10/2019 | Ozeki et al. |
| 10,647,032 B2 | 5/2020 | Radcliffe et al. |
| 10,676,393 B2 | 6/2020 | Weber et al. |
| 10,690,818 B2 | 6/2020 | Chen et al. |
| 10,694,010 B2 | 6/2020 | Jones |
| 10,781,135 B2 | 9/2020 | Weber et al. |
| 10,827,635 B1 | 11/2020 | Limarga et al. |
| 10,843,439 B2 | 11/2020 | Gulati et al. |
| 10,866,616 B2 | 12/2020 | Seo et al. |
| 10,917,505 B2 | 2/2021 | Jones |
| 10,948,633 B2 | 3/2021 | Murakami et al. |
| 2002/0127565 A1 | 9/2002 | Cunningham |
| 2003/0011315 A1 | 1/2003 | Ito et al. |
| 2005/0266250 A1 | 12/2005 | Hayakawa |
| 2006/0024508 A1 | 2/2006 | D'Urso et al. |
| 2006/0034042 A1 | 2/2006 | Hisano et al. |
| 2007/0195419 A1 | 8/2007 | Tsuda et al. |
| 2009/0257207 A1 | 10/2009 | Wang et al. |
| 2012/0127755 A1 | 5/2012 | Shiau et al. |
| 2012/0194974 A1 | 8/2012 | Weber et al. |
| 2012/0218640 A1 | 8/2012 | Gollier et al. |
| 2012/0274565 A1 | 11/2012 | Moser et al. |
| 2013/0026593 A1 | 1/2013 | Hermans et al. |
| 2013/0235462 A1 | 9/2013 | Haas |
| 2013/0273324 A1 | 10/2013 | Moll et al. |
| 2013/0296155 A1 | 11/2013 | Beall et al. |
| 2014/0035869 A1 | 2/2014 | Yun et al. |
| 2014/0063609 A1 | 3/2014 | Iwata et al. |
| 2014/0098075 A1 | 4/2014 | Kwak et al. |
| 2014/0106127 A1 | 4/2014 | Lyons et al. |
| 2014/0327643 A1 | 11/2014 | Sun et al. |
| 2015/0090689 A1 | 4/2015 | Guilfoyle et al. |
| 2016/0154435 A1 | 6/2016 | Yanagisawa et al. |
| 2016/0188181 A1 | 6/2016 | Smith et al. |
| 2016/0224822 A1 | 8/2016 | Hasegawa et al. |
| 2016/0283014 A1 | 9/2016 | Rider et al. |
| 2016/0306390 A1 | 10/2016 | Vertegaal et al. |
| 2017/0026553 A1 | 1/2017 | Lee et al. |
| 2017/0058130 A1 | 3/2017 | Addleman et al. |
| 2017/0276618 A1 | 9/2017 | Takagi |
| 2017/0308234 A1 | 10/2017 | Li et al. |
| 2018/0042131 A1 | 2/2018 | Liu et al. |
| 2018/0086662 A1 | 3/2018 | Luzzato et al. |
| 2018/0162091 A1 | 6/2018 | Takeda et al. |
| 2018/0162768 A1 | 6/2018 | Boek et al. |
| 2018/0215657 A1 | 8/2018 | Jin et al. |
| 2018/0282201 A1 | 10/2018 | Hancock et al. |
| 2019/0032237 A1 | 1/2019 | Kim et al. |
| 2019/0037690 A1 | 1/2019 | Wilson et al. |
| 2019/0155339 A1 | 5/2019 | Fenton et al. |
| 2019/0230204 A1 | 7/2019 | Zhang |
| 2019/0236887 A1 | 8/2019 | Rich et al. |
| 2019/0241455 A1 | 8/2019 | Sweney et al. |
| 2019/0246018 A1 | 8/2019 | Rho et al. |
| 2019/0256410 A1 | 8/2019 | Isshiki et al. |
| 2019/0331940 A1 | 10/2019 | Poole et al. |
| 2020/0026327 A1 | 1/2020 | Hendren et al. |
| 2020/0189966 A1 | 6/2020 | Lee et al. |
| 2020/0199020 A1 | 6/2020 | Hatano et al. |
| 2020/0301527 A1 | 9/2020 | Poole et al. |
| 2020/0379143 A1 | 12/2020 | Gu et al. |
| 2020/0385307 A1 | 12/2020 | Li et al. |
| 2020/0389991 A1 | 12/2020 | Shannon et al. |
| 2021/0014992 A1 | 1/2021 | Limarga et al. |
| 2021/0378117 A1 | 12/2021 | Shannon et al. |
| 2022/0071039 A1 | 3/2022 | Limarga et al. |

FOREIGN PATENT DOCUMENTS

| | | |
|---|---|---|
| CN | 103502166 | 1/2014 |
| CN | 203406929 | 1/2014 |
| CN | 104024929 | 9/2014 |
| CN | 104583147 | 4/2015 |
| CN | 105283322 | 1/2016 |
| CN | 107438494 | 12/2017 |
| CN | 107683055 | 2/2018 |
| CN | 207070526 | 3/2018 |
| CN | 107911964 | 4/2018 |
| CN | 107924002 | 4/2018 |
| CN | 10832510 | 10/2018 |
| CN | 207992872 | 10/2018 |
| CN | 109202296 | 1/2019 |
| CN | 208433428 | 1/2019 |
| CN | 208461858 | 2/2019 |
| CN | 109547679 | 3/2019 |

(56) References Cited

FOREIGN PATENT DOCUMENTS

| | | |
|---|---|---|
| CN | 109640557 | 4/2019 |
| DE | 10223165 | 12/2003 |
| EP | 3454541 | 3/2019 |
| JP | 2011510904 | 4/2011 |
| JP | 2013242725 | 12/2013 |
| JP | 2016045824 | 4/2016 |
| JP | 2017508178 | 3/2017 |
| JP | 2018506851 | 3/2018 |
| KR | 20130127842 | 11/2013 |
| KR | 20160145081 | 12/2016 |
| KR | 20170076779 | 7/2017 |
| KR | 20180018782 | 2/2018 |
| TW | 201910882 | 3/2019 |
| WO | WO2014/011328 | 1/2014 |
| WO | WO2014/012003 | 1/2014 |
| WO | WO2015/191949 | 12/2015 |
| WO | WO2016/088983 | 6/2016 |
| WO | WO2016/196615 | 12/2016 |
| WO | WO2017/038868 | 3/2017 |
| WO | WO2019/027675 | 2/2019 |

OTHER PUBLICATIONS

Ben-Yakar et al., "Femtosecond laser ablation properties of borosilicate glass," Journal of Applied Physics, vol. 96, No. 9, 8 pages, Nov. 1, 2004.

Hedayati et al., Antireflective Coatings: Conventional Stacking Layers and Ultrathin Plasmonic Metasurfaces, A Mini-Review, Materials, vol. 9, No. 497, 2016.

Qi et al., "Simple Approach to Wafer-Scale Self-Cleaning Antireflective Silicon Surfaces," American Chemical Society, State Key Laboratory of Supramolecular Structure and Materials, College of Chemistry, Jilin University, Changchun 130012, P.R. China, 2009.

Seth, Radhika, "A Fresh New Look at the Computer," https://www.yankodesign.com/2009/02/06/a-fresh-new-look-at-the-computer, 1 page, Feb. 6, 2009.

Tan et al., "Broadband antireflection film with moth-eye-like structure for flexible display applications," Optica, vol. 4, No. 7, pp. 678-683, Jul. 2017.

Wimmer, "Curve: Revisiting the Digital Desk," NordiCHI '10: Proceedings of the 6th Nordic Conference on Human-Computer Interaction: Extending Boundaries, https://doi.org/10.1145/1868914.1868977, http://www.mmi.ifi.lmu.de/pubdb/publications/pub/wimmer2010Curve/wimmer2010Curve.pdf, https://dl.acm.org/doi/10.1145/1868914.1868977, pp. 561-570, Oct. 2010.

TEXTURED GLASS COMPONENT FOR AN ELECTRONIC DEVICE ENCLOSURE

CROSS-REFERENCE TO RELATED APPLICATION(S)

This application is a continuation patent application of U.S. patent application Ser. No. 16/564,325, filed Sep. 9, 2019 and titled "Textured Glass Component for an Electronic Device Enclosure," which is a nonprovisional patent application of and claims the benefit of U.S. Provisional Patent Application No. 62/857,613, filed Jun. 5, 2019 and titled "Electronic Device Enclosure Having a Textured Glass Component," the disclosures of which are hereby incorporated by reference herein in their entireties.

FIELD

The described embodiments relate generally to electronic device enclosures that include textured glass components. More particularly, the present embodiments relate to textured glass components, cover assemblies, and enclosures for electronic devices.

BACKGROUND

Enclosures for electronic devices may traditionally be formed from a variety of components. Some traditional enclosures are formed from plastic or metal materials, which may be shaped and textured using a traditional molding or a machining technique. However, it may be more difficult to texture or shape enclosure components formed from a brittle material such as a glass. The techniques and articles described herein are directed to forming a texture and other surface features on a glass component of an enclosure.

SUMMARY

Textured glass components for electronic devices are disclosed herein. In some cases, a textured glass component such as a glass cover member may have a texture configured to provide a desired appearance to an exterior surface of the electronic device. For example, a glass cover member may have a texture configured to provide a particular gloss level and/or translucence level. The texture may also be configured to provide a particular "feel" to the electronic device, to be readily cleaned, or both.

As an example, the textured region of a glass component may be provided over a camera assembly of the electronic device. One or more openings may be provided in the textured region of the glass component to facilitate positioning of an optical module such as a camera module. An opening may also facilitate input or output to elements of the optical module. In some cases, the portion of the glass component including the textured region may be thicker than another portion of the glass component.

The disclosure provides an electronic device comprising a display, an enclosure at least partially surrounding the display, and a camera assembly. The enclosure comprises a front cover assembly including a front glass member positioned over the display and a rear cover assembly. The rear cover assembly includes a rear glass member defining a protruding portion. The protruding portion defines an opening and a textured region having gloss value less than about 50 as measured at 60 degrees. The camera assembly is coupled to an interior surface of the rear cover assembly and includes a camera module positioned at least partially within the opening.

In addition, the disclosure provides an electronic device comprising an enclosure including a cover member formed from a glass material and a camera assembly coupled to the interior surface of the cover member. The cover member defines an exterior surface comprising a raised region defining a first texture comprising surface features having a root mean square height from about 0.2 microns to about 2 microns and a base region defining a second texture different than the first texture, the raised region protruding with respect to the base region. The cover member further defines a through-hole extending from the raised region to an interior surface of the cover member. The camera assembly comprises a camera module positioned at least partially in the through-hole.

Further, the disclosure provides an electronic device comprising an enclosure including a front cover assembly comprising a front glass member, a rear cover assembly comprising a rear glass member, a camera assembly coupled to an interior surface of the rear cover assembly, and a display positioned below the front cover assembly. The rear cover assembly comprises a first glass portion having a first thickness and defining a textured region having a translucent appearance and defining surface features having a mean peak curvature (SSc) ranging from about 0.5 microns$^{-1}$ to about 2 microns$^{-1}$ and a root mean square slope (Sdq) from about 0.1 to about 1. The first glass portion further defines an opening positioned in the textured region. The rear cover assembly further comprises a second glass portion at least partially surrounding the first glass portion and having a second thickness less than the first thickness. The camera assembly comprises a camera module positioned at least partially within the opening.

BRIEF DESCRIPTION OF THE DRAWINGS

The disclosure will be readily understood by the following detailed description in conjunction with the accompanying drawings, wherein like reference numerals designate like elements.

Figure 1A:
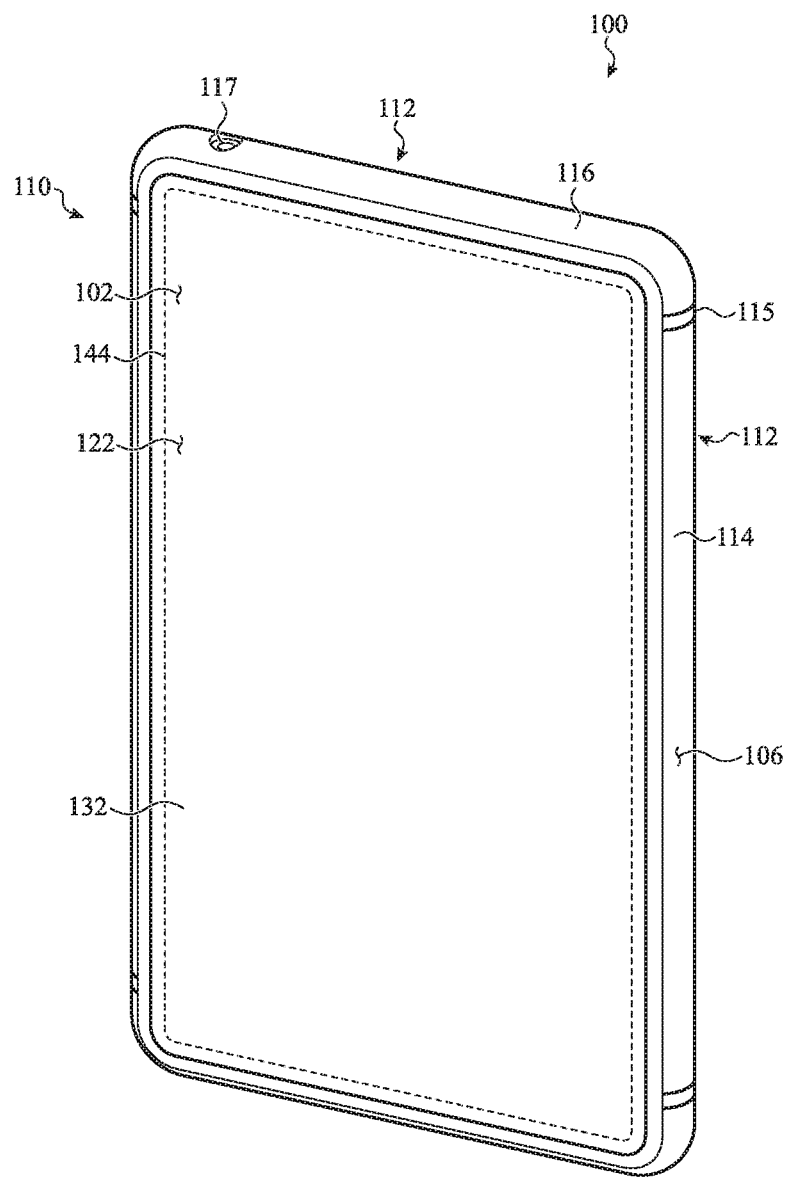
FIG. 1A shows front view of an example electronic device including a textured glass component.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred implementation. To the contrary, the described embodiments are intended to cover alternatives, modifications, and equivalents as can be included within the spirit and scope of the disclosure and as defined by the appended claims.

The following disclosure relates to textured glass components for electronic devices. A textured region of a glass component, such as a glass cover member or a glass member, may be configured to provide a desired appearance to an exterior surface of an electronic device. In addition, the texture may be configured to provide a particular "feel" to the electronic device, to be readily cleaned, or both. The textured glass component may be chemically strengthened to enhance its resistance to impact and/or bending.

In some embodiments, a glass component may have a texture configured to provide certain properties while minimizing other properties which are less desirable. For example, the texture may be configured to have roughness parameters which provide particular levels of optical properties such as gloss and/or transmissive haze, while avoiding an overly rough or sharp "feel." The texture may provide a balance of functionality. For example, increasing the value of a roughness parameter to reduce the gloss or increase the haziness of the surface may, in some cases, provide an overly rough "feel" or undesirably reduce the cleanability of the surface. In some cases, different regions of the glass component may have different textures in order to provide different properties to the different regions.

The textured region of the glass component, such as a glass cover member or glass member, may produce a semi-gloss or a low gloss effect. For example, the gloss may be less than about 50 gloss units, less than about 40 gloss units, from 5 gloss units to 50 gloss units, from 10 gloss units to 50 gloss units, or from 10 gloss units to 45 gloss units as measured at 60 degrees.

The textured region of a glass component may produce a translucent or hazy effect. The transmissive haze may relate to the amount of light subject to wide angle scattering (e.g., greater than 2.5 degrees). Glass components with greater amounts of transmissive haze may have reduced transmissive contrast. The transmissive haze may be greater than or equal to about 50%, greater than or equal to about 60%, greater than or equal to about 70%, from about 60% to about 90%, or from about 70% to about 80%.

The textured region of the glass component and of a cover assembly including the glass component may be configured to provide a particular coefficient of friction or otherwise may produce a particular tactile feel to a user when the textured region is touched. For example, the textured region may be configured to have a coefficient of friction, for a finger touching or sliding along the textured region, that is within a specified range, thereby providing a desired tactile feel to the enclosure. A user may touch or slide a finger along the textured region, for example, as a result of normal handling of the electronic device.

The textured region of the glass component and of the cover assembly may also be configured so that dirt or debris accumulated from normal handling of the electronic device is readily cleanable or removable. For example, the textured region may be configured so that it does not create and/or trap textile debris. As explained in more detail below, the texture may be configured so that a root mean square (RMS) height of the features, a root mean square (RMS) slope of the surface features is not overly large, and/or the mean peak curvature provides the desired optical and tactile properties. More detailed description of these and other texture parameters is provided with respect to FIG. 5 and, for brevity, will not be repeated here.

The discussion herein with respect to properties of textured glass cover members also relates more generally to textured glass components as described herein. These and other embodiments are discussed below with reference to FIGS. 1A-9. However, those skilled in the art will readily appreciate that the detailed description given herein with respect to these figures is for explanatory purposes only and should not be construed as limiting.

FIG. 1A shows a front view of an example electronic device 100 including a textured glass component. The electronic device 100 may be a mobile telephone (also referred to as a mobile phone). In additional embodiments, the electronic device 100 may be a notebook computing device (e.g., a notebook or laptop), a tablet computing device (e.g., a tablet), a portable media player, a wearable device, or another type of portable electronic device. The electronic device 100 may also be a desktop computer system, computer component, input device, appliance, or virtually any other type of electronic product or device component.

As shown in FIG. 1A, the electronic device 100 has an enclosure 110 including a cover assembly 122. The cover assembly 122 may at least partially define a front surface 102 of the electronic device 100. In this example the cover assembly 122 defines a substantial entirety of a front surface of the electronic device 100. The cover assembly 122 is positioned over the display 144 and may define a transparent portion positioned over the display 144. The enclosure 110 may at least partially surround the display 144.

As shown in FIG. 1A, the enclosure 110 further includes a housing member 112 (which may also be referred to simply as a housing or a housing component). The cover assembly 122 may be coupled to the housing 112. For example, the cover assembly 122 may be coupled to the housing 112 with an adhesive, a fastener, an engagement feature, or a combination thereof.

The housing 112 may at least partially define a side surface 106 of the electronic device 100 and may include one or more metal members or one or more glass members.

In this example, the housing 112 defines all four sides or a continuous side surface of the electronic device 100. As shown in FIG. 1A, the housing 112 is formed from a series of metal segments (114, 116) that are separated by polymer or dielectric segments 115 that provide electrical isolation between adjacent metal segments. For example, a polymer segment 115 may be provided between a pair of adjacent metal segments. One or more of the metal segments (114, 116) may be coupled to internal circuitry of the electronic device 100 and may function as an antenna for sending and receiving wireless communication.

The housing 112 may define one or more openings or ports. As shown in FIG. 1A, the metal segment 116 of the housing 112 defines an opening 117. The opening 117 may allow (audio) input or output from a device component such as a microphone or speaker or may contain an electrical port or connection.

A cover assembly such as the cover assembly 122 typically includes a glass cover member 132, also referred to herein as a glass member. As shown in FIG. 1A, the cover assembly 122 is a front cover assembly and the glass member 132 is a front glass member. Examples of glass cover members are shown in FIGS. 2A-5 and 7-8 and the description provided with respect to these figures is generally applicable herein. In some embodiments a cover assembly may be described as a glass cover. More generally, a cover assembly may be formed from multiple layers. For example, a multilayer cover assembly may include one or more glass sheets, polymer sheets, and/or various coatings and layers. In some cases, a glass cover member may extend laterally across the cover assembly, such as substantially across the width and the length of the cover assembly. In additional cases, a cover assembly may include multiple cover glass members that together substantially extend laterally across the cover assembly.

Typical cover assemblies herein are thin, and typically have a glass cover member that is less than 5 mm in thickness, and more typically less than 3 mm in thickness. In some aspects, a glass cover member of a cover assembly, such as glass cover members 132 and 134, can have a thickness from about 0.1 mm to 2 mm, from 0.5 mm to 2 mm, or from 0.2 mm to 1 mm. As described herein, the glass cover members may have a non-uniform thickness.

Figure 1B:
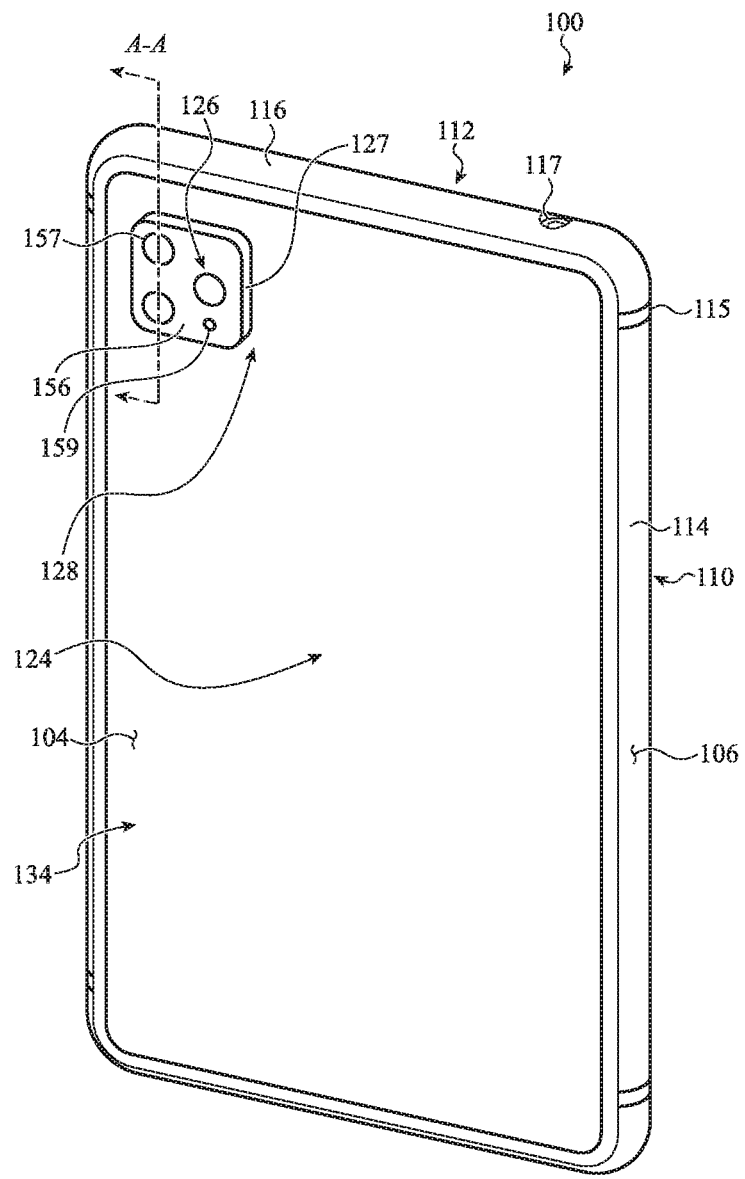
FIG. 1B shows a rear view of the electronic device of FIG. 1A.

Although the cover assembly 122 is shown in FIG. 1A as being substantially planar, the principles described herein also relate to cover assemblies and glass components which define a surface protrusion (such as shown in FIG. 1B), a surface recess, and/or one or more curved surfaces. In embodiments, a glass component such as a glass cover member may be three-dimensional or define a contoured profile. For example, the glass component may define a peripheral portion that is not coplanar with respect to a central portion. The peripheral portion may, for example, define a side wall of a device housing or enclosure, while the central portion defines a front surface (which may define a transparent window that overlies a display).

In additional embodiments, cover assemblies as described herein may be included in an all glass or a multi-faceted glass enclosure. In such embodiments, a cover assembly may define one or more surfaces of the enclosure, such as a front surface and a side surface, or a front surface, a side surface and a rear surface. A cover assembly for such an enclosure may include a glass component, a glass cover member, or a combination thereof.

Figure 2A:
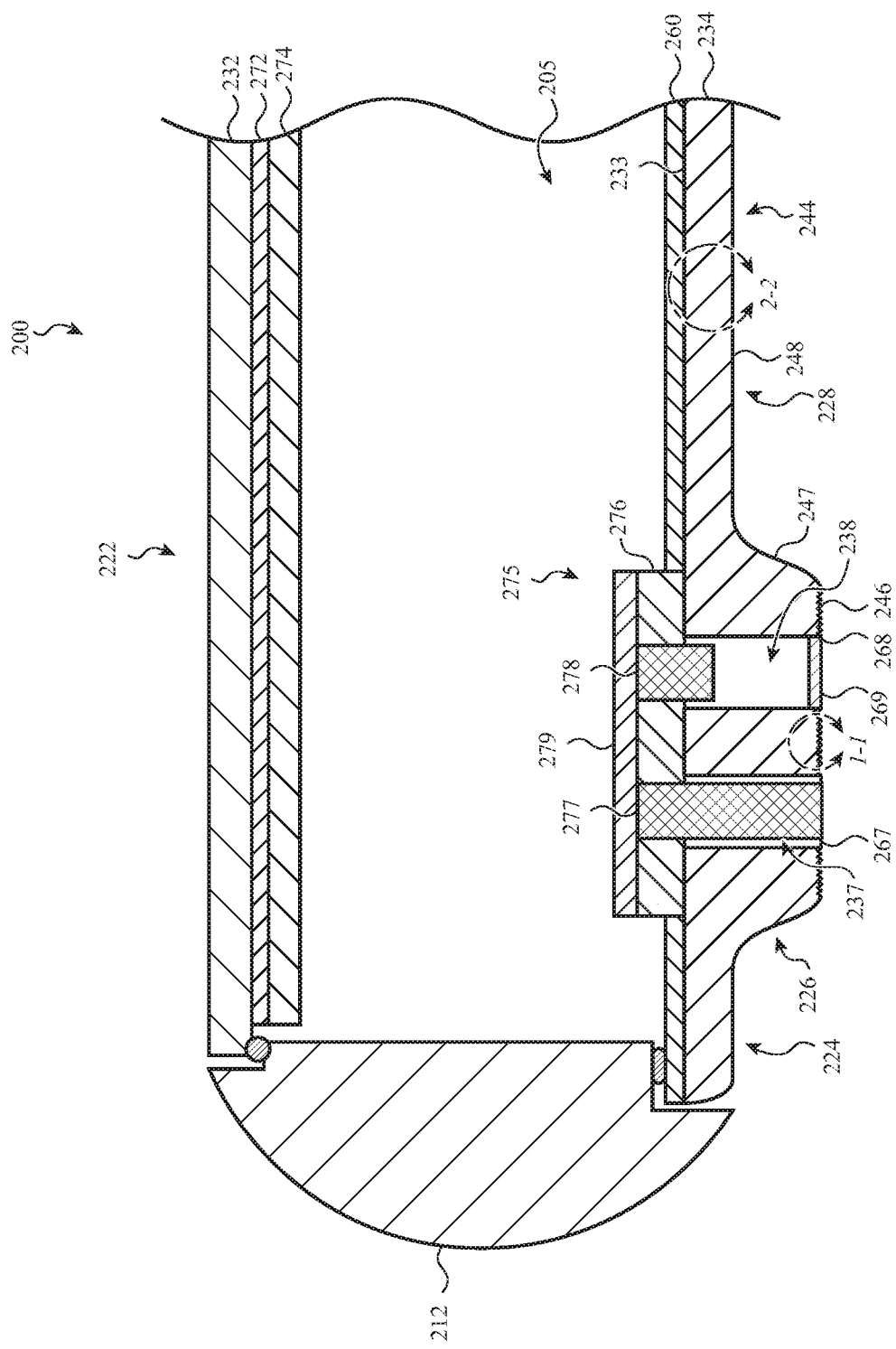
FIG. 2A shows a partial cross-section view of an electronic device.
Figure 3:
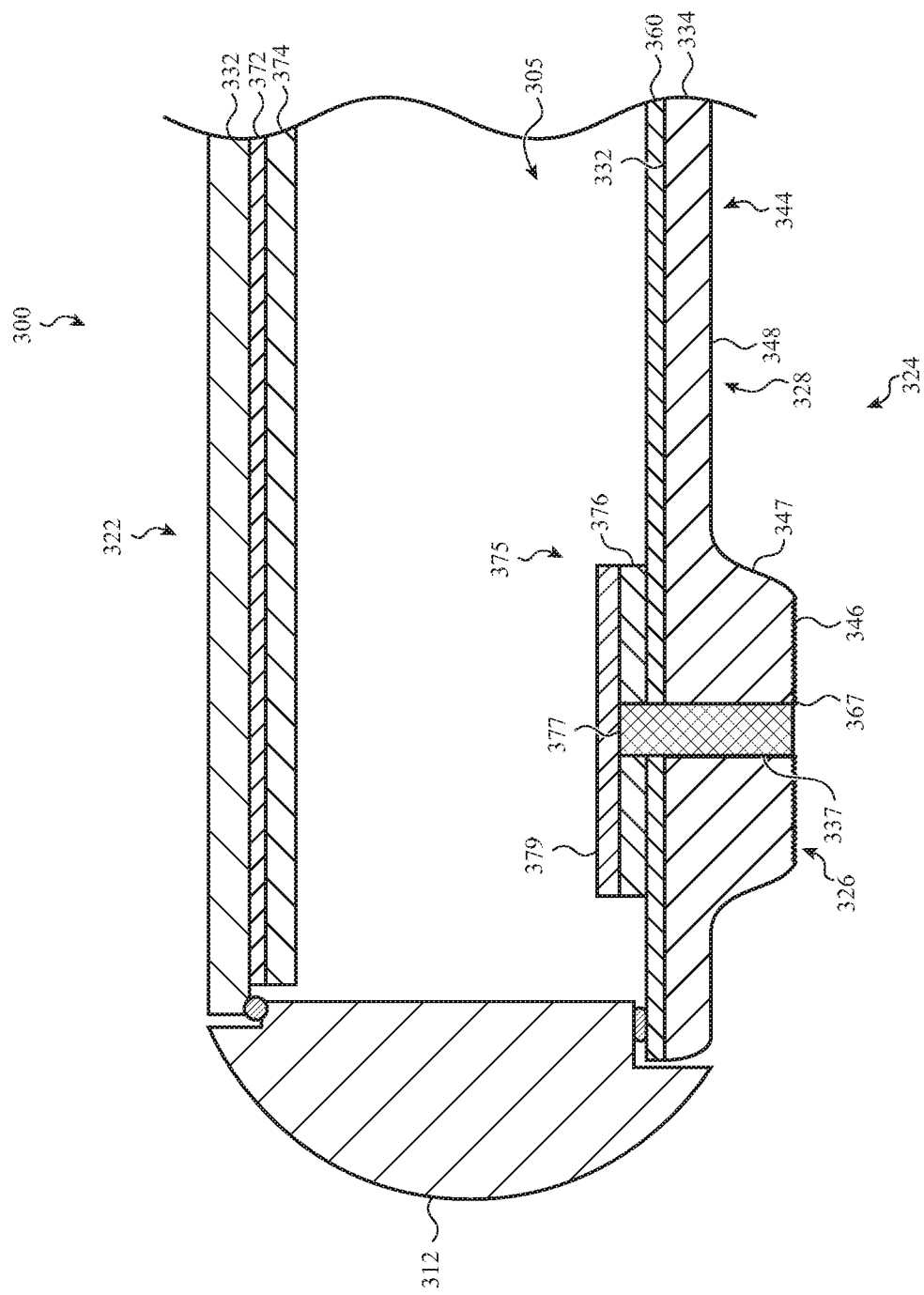
FIG. 3 shows a partial cross-section view of an electronic device.

FIG. 1B shows a rear view of the electronic device 100. As shown in FIG. 1B, the enclosure 110 includes a cover assembly 124, which defines a rear surface 104 of the electronic device. In the example of FIG. 1B, the cover assembly 124 defines a substantial entirety of the rear surface of the electronic device. The cover assembly 124 includes a glass cover member 134. As shown in FIG. 1B, the cover assembly 124 is a rear cover assembly and the glass cover member 134 is a rear glass member. In some cases, the electronic device 100 includes a camera assembly coupled to an interior surface of the cover assembly 124 (as shown in FIGS. 2A and 3).

As shown in FIG. 1B, the cover assembly 124 defines a first portion 126 which protrudes or is offset with respect to a second portion 128 of the cover assembly 124. The first portion 126 may also be referred to herein as a protruding portion and the second portion 128 may also be referred to herein as a base portion. The second portion 128 may at least partially surround the first portion 126. The first portion 126 may have a thickness greater than the second portion 128. For example, the first portion 126 may be at least 10%, 25%, or 50% and up to about 250% thicker than the second portion 128. In some cases, the first portion 126 may have a thickness greater than about 1 mm and less than or equal to about 2 mm and the second portion may have a thickness greater than about 0.5 mm and less than about 1 mm. The amount of protrusion or offset between a raised exterior surface of the first portion 126 and an exterior surface of the second portion 128 may be from about 0.5 mm to about 1.5 mm. The size of the first portion 126 may depend at least in part on the size of the camera assembly. In some embodiments, a lateral dimension (e.g., a width) of the protruding portion may be from about 5 mm to about 30 mm or from about 10 mm to about 20 mm.

The cover assembly 124 shown in FIG. 1B further defines a third region 127. In some cases, the third region 127 may define an exterior surface which extends between a raised exterior surface of the first portion 126 and the exterior surface of the second portion 128. The third region 127 may also be referred to herein as a side region. FIG. 2A provides additional description of exterior surface regions of a cover assembly. The description provided with respect to FIG. 2A is generally applicable herein and, for brevity, is not repeated here.

As shown in FIG. 1B, the first portion 126 defines a textured region 156 of the electronic device 100. The textured region 156 may have a texture configured to provide a desired appearance to an exterior surface of the electronic device 100. In addition, the texture of the textured region 156 may be configured to provide a particular "feel" to the electronic device, to be readily cleaned or both. The textured region 156 typically has at least one roughness parameter greater than that of a polished surface, such as a conventionally polished surface. In some cases, the textured region 156 may extend over a raised exterior surface of the first portion 126, but may not substantially extend over the third region 127.

The texture of the textured region 156 may be similar or different to that of another portion of the cover assembly. For example, the second portion 128 may have a texture which is smoother than that of the textured region 156 of the first portion 126. In some cases, the second portion 128 may have a texture similar to that of a polished surface. In addition, the third region 127 may have a texture which is smoother than that of the textured region 156. In some cases, the third portion 127 may have a texture similar to that of a polished surface.

Typically, the electronic device 100 includes a camera assembly which includes one or more optical modules 157. The example of FIG. 1B shows three optical modules 157, but more generally the camera assembly may define any number of optical modules 157, such as one, two, three, four, or five optical modules. Each of the optical modules 157 may be substantially flush with, proud of, or recessed with respect to the textured region 156.

The optical modules 157 may include, but are not limited to, a camera module, an illumination module, a sensor, and combinations thereof. In some cases, a camera module includes an optical sensing array and/or an optical component such as a lens, filter, or window. In additional cases, a camera module includes an optical sensing array, an optical component, and a camera module housing surrounding the optical sensing array and the optical components. The camera module may also include a focusing assembly. For example, a focusing assembly may include an actuator for moving a lens of the camera module. In some cases, the optical sensing array may be a complementary metal-oxide semiconductor (CMOS) array or the like.

The first portion 126 of the cover assembly 124 may define at least one hole (also referred to herein as a through-hole) which extends through the cover assembly from the textured region 156 to an interior surface of the cover assembly. Therefore, the first portion 126 of the cover assembly may also define at least one opening in the exterior surface 104 with the opening corresponding to the entrance to (or exit from) the through-hole. The opening in the exterior surface 104 may be located in the textured region 156. As examples, the through-hole or opening may have a lateral dimension (e.g., a width or diameter) from about 1 mm to about 10 mm. A lateral dimension of a textured region between edges of adjacent openings may be from about 1 mm to about 15 mm or from about 1 mm to about 10 mm.

In some cases, the first portion 126 may define an arrangement, array, or set of through-holes extending through the first portion 126 (as shown in the partial cross-section views of FIG. 2A). The first portion 126 may further define an arrangement, array, or set of openings in the exterior surface of the cover assembly 124.

An optical module 157 may be positioned at least partially within an opening in the textured region 156, as shown in FIG. 1B. The optical module 157 may also be positioned at least partially within a through-hole in the first portion 126 (as shown in the partial cross-section view of FIGS. 2A and 3). The camera assembly may be coupled to an interior surface of the cover assembly as shown in FIGS. 2A and 3.

As previously noted, the cover assembly 124 includes a glass cover member 134. In some cases, the shape of the glass cover member 134 may generally correspond to the shape of the cover assembly and may extend across a substantial entirely of the rear surface of the electronic device. In additional cases, the cover assembly may include multiple glass cover members. For example, a first glass cover member may define the first portion of the cover assembly and a second glass cover member may define the second portion of the cover assembly. The first glass cover member and the second glass cover member may be coupled together by a fastener or other attachment part alone or in combination with an adhesive. The fastener or other attachment part may at least partially define a third region of the cover assembly. The cover assembly 124 may further include a smudge-resistant coating, a cosmetic coating, or a combination thereof (as shown, for example, in FIGS. 2B-2C).

Figure 5:
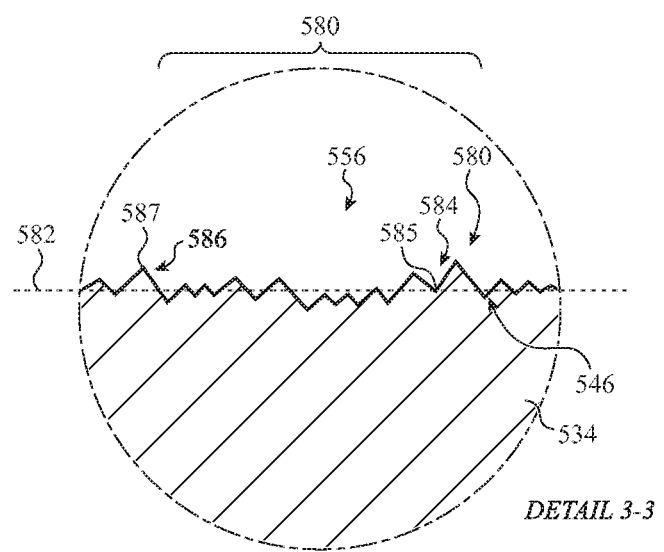
FIG. 5 shows a detailed cross-section view of a textured region of a glass cover member of an electronic device.

The texture of the textured region 156 may result from texturing of the glass cover member 134. In some cases, the glass cover member 134 may have multiple textured regions. Each of the various textured regions of the glass cover member 134 may have similar textures to each other or may have different textures from each other. Different textures may result from using different process conditions in a single type of texturing process or may result from using different types of texturing processes. In some embodiments, a textured region of the glass cover member 134 may have a texture formed by overlap of two different textures. Such a texture may result from using two different texturing processes to create the textured region. Different methods for forming textures on the glass cover member 134 are discussed with respect to FIG. 6 and those details are generally applicable herein. Further, the discussion of surface textures provided with respect to FIG. 5 is generally applicable herein.

Figure 9:
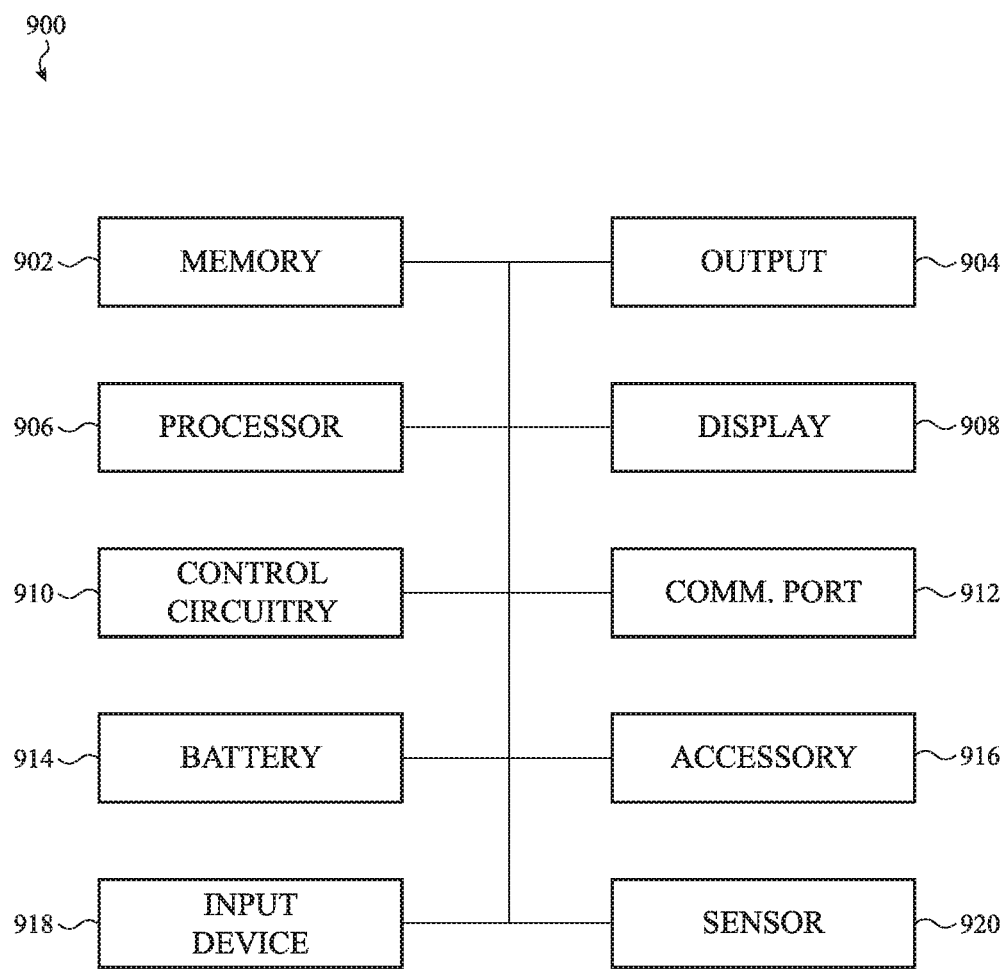
FIG. 9 shows a block diagram of a sample electronic device that can incorporate a textured glass component.

In addition to a display and a camera assembly, the electronic device 100 may include additional components. These additional components may comprise one or more of a processing unit, control circuitry, memory, an input/output device, a power source (e.g., battery), a charging assembly (e.g., a wireless charging assembly), a network communication interface, an accessory, and a sensor. Components of a sample electronic device are discussed in more detail below with respect to FIG. 9. and the description provided with respect to FIG. 9 is generally applicable herein.

FIG. 2A shows a partial cross-section view of an electronic device 200. The electronic device 200 may be similar to the electronic device 100 of FIGS. 1A and 1B and the cross-section may be taken along A-A. The electronic device 200 includes a cover assembly 222 at the front and a cover assembly 224 at the rear of the electronic device 200. Each of the cover assembly 222 and the cover assembly 224 is coupled to a housing component 212, such as with an adhesive, a fastener, or a combination thereof. The housing component 212 may be similar to the housing components 112, 114, and 116 of FIG. 1. The housing component 212 at least partially defines an interior cavity 205 of the electronic device 200.

The cover assembly 222 includes a glass cover member 232 and the cover assembly 224 includes a glass cover member 234. A glass cover member, such as glass cover members 232 and 234, may be formed from a glass material. The cover assembly 224 defines a protruding portion 226 (also referred to as a first portion) which protrudes with respect to a base portion 228 (also referred to as a second portion) due to the greater thickness of the glass cover member 234 in the protruding portion. Typically at least part of the base portion 228 is substantially adjacent the protruding portion 226.

As shown in FIG. 2A, the cover assembly 224 further defines an exterior surface 244. A region 246 of the exterior surface 244 is defined by the protruding portion 226 and a region 248 of the exterior surface 244 is defined by the base portion 228. The region 246 protrudes or is raised with respect to the second portion 248 and may therefore be referred to as a raised region, an offset region, or an outer region. As an example, the raised region 246 may define a plateau. The region 248 may be referred to herein as a base region. A region 247 of the exterior surface 244 may extend between the region 246 and the region 248 and may define a side of the protruding portion 226. As schematically shown in FIG. 2A, the region 246 may include a textured region. In the example of FIG. 2A, the region 246 has a rougher texture than the region 248 or the region 247, as shown in more detail in FIGS. 2B and 2C.

The electronic device 200 further includes a display 274 and a touch sensor 272 provided below the front cover assembly 222. The display 274 and the touch sensor 272 may be coupled to the front cover assembly 222. The display 274 may be a liquid-crystal display (LCD), a light-emitting diode (LED) display, an LED-backlit LCD display, an organic light-emitting diode (OLED) display, an active layer organic light-emitting diode (AMOLED) display, and the like. The touch sensor 272 may be configured to detect or measure a location of a touch along the exterior surface of the front cover assembly 222.

Figure 2B:
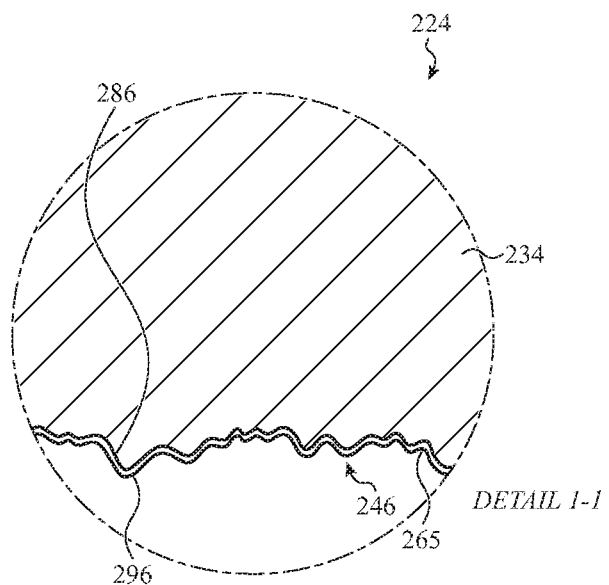
FIG. 2B shows a detail view of one portion of a cover assembly of an electronic device.
Figure 2C:
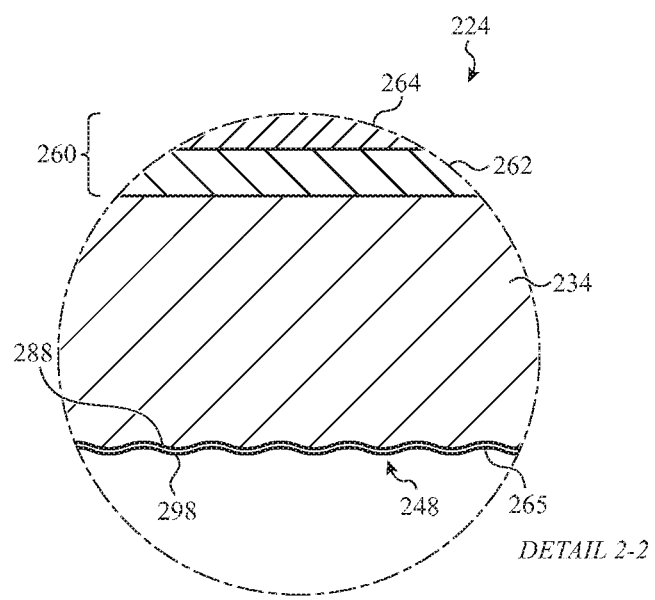
FIG. 2C shows a detail view of another portion of the cover assembly of an electronic device.

The cover assembly 224 further includes a cosmetic or decorative coating 260 disposed along an interior surface 233 of the glass cover member 234, as shown in FIGS. 2A and 2C. When the cover assembly and glass cover member over the cosmetic coating is textured, the appearance of the electronic device may be due to the combined effect of the textured region and the cosmetic coating. As shown in FIG. 2A, the cosmetic coating 260 is positioned underneath the base portion 228 of the cover assembly 224 and in some cases may provide the base portion 228 with a desired color. In additional cases, the cosmetic coating 260 may function as a masking layer. In the example of FIG. 2A, the cosmetic coating does not substantially extend under the protruding portion 226 and the protruding portion 226 may have a different color than the base portion 228. In some cases, the protruding portion 226 (or the corresponding protruding portion of the glass cover member) may appear to be substantially colorless. For example, the absolute value of each of a* and b* may be less than 5, less than 3, or less than or equal to 2 and the value of L* may be greater than 90, greater than 95, or greater than 98.

The electronic device 200 further includes a camera assembly 275. The partial cross-section view of FIG. 2A shows two optical modules (277, 278) of the camera assembly 275. As shown in FIG. 2A, the camera assembly 275 is coupled to an interior surface 233 of the glass cover member 234, although in additional examples the camera assembly may be coupled to another interior surface of the cover assembly 224 (as shown in FIG. 3). For example, the camera assembly 275 may be coupled to the interior surface of the cover assembly 224 with an adhesive bond, as may be provided by an adhesive layer. As an additional example, the camera assembly 275 may be coupled to the interior surface of the cover assembly 224 with a fastener or other form of mechanical attachment.

The camera assembly 275 further includes a support structure 276 which is coupled to an interior surface 233 of the glass cover member 234 of the cover assembly 224. The support structure 276 may be configured to hold various elements of the camera assembly 275 in place. For example each of the optical modules 277 and 278 and a printed circuit board (PCB) 279 may be mounted to the support structure 276. The shape of the support structure 276 is not limited to the example of FIG. 2A. In some cases, the support structure 276 may include a plate, a bracket, or a combination thereof.

The support structure 276 and the coupling between the camera assembly 275 and the interior surface of the cover assembly 224 may be configured to limit bending of the glass cover member 234 in the vicinity of the protruding portion 226. For example, the support structure 276 may be configured to limit bending which would tend to increase outwards curvature of the region 246 of the protruding portion 226 (and increase its convexity). Limiting bending of the protruding region can limit bending-induced tensile stress along the textured region 256. Further, the coupling between the camera assembly 275 and the interior surface of the cover assembly 224 may be sufficiently rigid so that the position of a neutral axis of the combination of the cover assembly 224 and the camera assembly 275 is shifted as compared to the corresponding neutral axis of the cover assembly 224 alone. For example, the neutral axis of the combination of the cover assembly 224 and the camera assembly 275 may be shifted inward, away from the exterior surface 244, as compared to the corresponding neutral axis of the cover assembly 224 alone. In some cases, the shifting of the neutral axis may be most pronounced in the protruding portion 226 of the cover assembly 224.

As previously described with respect to FIG. 1B, the cover assembly 224 may define holes 237 and 238 extending through the protruding portion 226. Holes 237 and 238 may also be referred to herein as through-holes. As shown in FIG. 2A, the glass cover member 234 also at least partially defines the holes 237 and 238. The cover assembly 224 further defines openings 267 and 268 to the holes 237 and 238. The openings 267 and 268 are located in the region 246, which may be a textured region.

The first optical module 277 and the second optical module 278 are respectively aligned with the through-holes 237 and 238. As shown in FIG. 2A, the first optical module 277 extends substantially through the first through-hole 237 and the second optical module 278 extends at least partially through the second through-hole 238. In the example of FIG. 2A, the optical module 277 may extend through the opening 267 so that an end of the optical module 277 extends beyond (is proud of) the opening 267 and the surface region 246. The end of the optical module 278 is recessed with respect to the opening 268. In other examples, an end of an optical module may be flush with an opening, as shown in FIG. 3.

As previously described with respect to FIG. 1B, an optical module may comprise a camera module, an illumination module, an optical sensor or the like. Typically the camera assembly 275 includes at least one camera module and may include two, three, four or five camera modules. The camera module is electrically connected to the PCB 279.

In some cases, a window may be positioned within an opening. As shown in FIG. 2A, a window 269 is positioned within the second opening 268. The first optical module 277 may also include a window as part of its optical components, with the window being positioned within its housing.

FIG. 2B is a detail view showing the protruding portion 226 (detail 1-1) and FIG. 2C is a detail view showing the base portion 228 (detail 2-2) of the cover assembly 224. The scale of FIGS. 2B and 2C is exaggerated in order to better illustrate details of the cover assembly 224. As schematically shown in FIGS. 2A-2C, the region 246 may define a first texture and the region 248 may define a second texture which is different than the first texture. In the example of FIGS. 2A 2C, the region 246 has a rougher texture than the region 248. In addition, the region 246 has a rougher texture than the region 247. For example, the region 246 may have at least one roughness parameter, such as a root mean square surface height, a root mean square slope, and/or a mean peak curvature, which is greater than that of the region 248 and/or the region 247. More generally, the different regions of the exterior surface 244 may have similar textures to each other or may have different textures from each other as previously described with respect to FIG. 1B.

In some cases, the first texture of the protruding portion 226 and the second texture of the base portion 228 may be configured to provide somewhat different optical effects. For example, when the decorative coating 260 provides a desired color to the base portion 228 and the protruding portion 226 has a substantially colorless appearance, the first texture of the protruding portion 226 may be configured to provide a greater amount of translucency than the second texture of the base portion 228. In some cases, the second texture of the base portion 228 may be substantially transparent and may correspond to the texture of a polished surface. As an additional example, the first texture of the protruding portion may be configured to provide a lower gloss than the window 269, but may provide a higher gloss than the second texture of the base portion 228.

In addition, the first texture of the protruding portion 226 and the second texture of the base portion 228 may be configured to provide somewhat different tactile effects. For example, the second texture of the base portion 228 may be configured to provide a smoother feel to a user than the first texture of the protruding portion.

The texture of a given region of the cover assembly 224 may result, at least in part, from texturing of the glass cover member 234. Surface features (e.g., surface features 286 and 288) formed on the glass cover member 234 and the exterior coating 265 together may define surface structures on the cover assembly (e.g., surface structures 296 and 298). Different textures of the glass cover member 234 may result from using different process conditions in a single type of texturing process or may result from using different types of texturing processes. Different methods for forming textures on the glass cover member 234 are discussed with respect to FIG. 6 and those details are applicable here. Further, the discussion of surface textures and surface features provided with respect to FIG. 5 is applicable herein but, for brevity, is not repeated here.

In some cases, the cosmetic coating 260 comprises a polymer. The cosmetic coating 260 may comprise at least 40%, 50%, 60%, or 70% of the polymer and may therefore be referred to as a polymer-based coating or a polymeric coating. When the coating 260 further comprises a colorant, the polymer may act as a binder for the colorant. The colorant (e.g., a pigment) may be substantially dispersed in a matrix of the polymer. As examples, the polymer may be polyester-based, epoxy-based, urethane-based, or based on another suitable type of polymer or copolymer. The cosmetic coating 260 may further comprise optional additives such as one or more extenders, diluents, polymerization initiators, and/or stabilizers. In some embodiments, the polymer has a cross-linked structure.

In some cases, the cosmetic coating may include a color layer (e.g., an ink, dye, paint, etc.) and/or a metal layer. As previously described, the cosmetic coating 260 may include at least one color layer. The color layer may comprise a polymer and a colorant dispersed in the polymer and may be transparent, translucent, or opaque. More generally, any pigment, paint, ink, dye, sheet, film, or other layer may be used as the cosmetic coating 260 or a portion thereof. In some embodiments, the cosmetic coating 260 is a multilayer coating that includes a first color layer and a second color layer. Each of the color layers may be transparent, translucent, or opaque. Each of the color layers may include the same colorant or different color layers may include different colorants. The thickness of each of the color layers in the cosmetic coating 260 may be from about 2 microns to about 10 microns.

The color layer(s) and the cosmetic coating 260 may have a chromatic color or an achromatic color. The color of the cosmetic coating 260 may be characterized using a color model. For example, in the hue-saturation-value (HSV) color model, the hue relates to the wavelength(s) of visible light observed when the color feature is viewed (e.g., blue or magenta) and the value relates to the lightness or darkness of a color. The saturation relates to the perceived colorfulness as judged in proportion to its brightness. As another example, coordinates in CIEL*a*b* (CIELAB) color space may be used to characterize the color, wherein L* represents brightness, a* the position between red/magenta and green, and b* the position between yellow and blue.

In some cases, the cosmetic coating 260 as viewed through given region of the cover assembly 224 may have a uniform appearance. For example, the cosmetic coating 260 may appear uniform to the unaided eye (also referred to as being visually uniform). The cosmetic coating 260 may have a color variation less than a specified value. For example, an image of the coating as viewed through the glass cover member may be obtained using a digital camera and the color of each pixel of the image may be determined, thereby allowing determination of the color and/or lightness variation. The color uniformity over the textured region may be assessed by assessing the uniformity of the color values obtained using a given color model. For example, the variation in L*, a*, b*, or a combination thereof may be less than about 20%, 15%, 10%, or 5% as measured through a textured region, such as region 248.

In some cases a reference value of the color uniformity may be measured for the cosmetic coating 260 and a perceived color uniformity value of the cosmetic coating 260 as viewed through the textured region 230 may be compared to the reference value. For example, the reference value of the color uniformity may be a first color uniformity value and the perceived color uniformity value of the cosmetic coating 260 as viewed through region of the cover assembly 224 may be a second color uniformity value. In some cases, the second color uniformity value may be the same or substantially the same as the first color uniformity value. For example, the difference between the second color uniformity value and the first color uniformity value may be visually imperceptible. In additional examples, the variation between the second color uniformity value and the first color uniformity value may be less than about 20%, 15%, 10%, or 5%. As previously discussed, a color uniformity value may be determined from the variation in L*, a*, b*, or a combination thereof or by other color measurement techniques.

For example, a reference value of the color uniformity may be obtained for the cosmetic coating 260 as applied to a glass cover member who lacks a textured surface as described herein. Instead, the glass cover member used to obtain the reference value may have an as-manufactured surface or a polished surface. The as-manufactured surface or polished surface may have an RMS surface height less than that of a textured surface as described herein.

In some cases, the cosmetic coating 260 may include multiple layers, such as a first layer 262 and a second layer 264 as schematically shown in FIG. 2C. As examples, the cosmetic coating 260 may include an additional color layer, a metal layer, an optically clear layer, an optically dense layer, and combinations thereof. In additional cases, the cosmetic coating need not include a color layer, but may include one or more of an optically dense layer and a metal layer.

For example, the cosmetic coating 260 may include an optically dense layer The optically dense layer may substantially reduce or prevent transmission of visible light, thereby "blocking" the view through the cover assembly 224 of components positioned behind the optically dense layer. In addition, the optical properties of the optically dense layer may be configured to adjust the lightness and/or the chroma of the cosmetic coating 260.

For example, the optical density of the optically dense layer may be described by OD=$\log_{10}$ (initial intensity/ transmitted intensity) and may be greater than or equal to 1, greater than or equal to 2, or greater than or equal to 3. Generally, the optically dense layer (e.g., layer 264) comprises a polymer. The optically dense layer may further comprise one or more pigments, dyes, or a combination thereof. As an example, the optically dense layer has a substantially wavelength independent (neutral) reflectance and/or absorption spectrum over the visible range. In addition, the optically dense layer may have an achromatic characteristic color. The thickness of the optically dense layer may be from about 2 microns to about 10 microns.

In further embodiments, the cosmetic coating 260 may comprise a metal layer in addition to one or more color layers. Such a metal layer may give a metallic effect to the cosmetic coating as seen through the cover assembly 224. When used to form a metallic marking, the metal layer may be a partial layer (e.g., having a smaller lateral dimension than a color layer). For example, the metal of the layer may be selected from aluminum, copper, nickel, silver, gold, platinum, and alloys thereof. In some cases, the metal layer may be configured to at least partially transmit visible light. For example, the metal layer may have a thickness greater than about 0.5 nm and less than 10 nm, less than 5 nm, less than 3 nm, less than 2 nm, or less than 1 nm. Thicker metal layers may be used for forming an indicium or another marking under the glass cover member. The marking may be in the form of an image, a pattern, text, a glyph, a symbol, indicia, a geometric shape, or a combination thereof.

The metal layer may be disposed along an interior surface of the glass cover member 234. In some cases the metal layer may be used in combination with an optically clear layer. The optically clear layer may have one or more mechanical properties (e.g., modulus, hardness and/or toughness) which limit or prevent propagation of cracks from the metal layer into the glass cover member 234. The optically clear layer may be a polymeric layer and may have a thickness from about 1 micron to about 5 microns. The optically clear layer may be disposed along the interior surface 233 of the glass cover member 234, the metal layer may be positioned between the optically clear layer and the optically dense layer, a first color layer may be positioned between the metal layer and the optically dense layer, and a second color layer may be positioned between the first color layer and the optically dense layer.

In addition, the cosmetic coating may comprise additional polymeric layers behind and disposed along the optically dense layer. If components of the electronic device are glued to the cosmetic coating, these additional layers may include a protective layer which protects the color layers of the multilayer coating from damage due to the glue. The additional layers may further include a layer inwards of the protective layer which facilitates adhesion of the cosmetic coating to the glue.

In addition, the detail views of FIGS. 2B and 2C show that regions of the exterior surface 244, such as regions 246 and 248, may be defined by an exterior coating 265 applied to the glass cover member 234. The exterior coating 265 may provide resistance to oils and other deposits on the electronic device and may be referred to as a smudge-resistant coating or as an oleophobic coating. The exterior coating 265 may comprise a fluorinated material, such as a fluorinated oligomer or polymer, to impart oleophobic and/or hydrophobic properties. In embodiments, the layer of the fluorinated material is from about 5 nm to about 20 nm thick or from about 10 nm to about 50 nm thick. The layer of the fluorinated material may be bonded directly to the surface features or may be bonded to an intermediate adhesion layer.

FIG. 3 shows a partial cross-section view of an electronic device 300. The electronic device 300 may be similar to the electronic device 100 of FIGS. 1A and 1B. The electronic device 300 includes a cover assembly 322 at the front and a cover assembly 324 at the rear of the electronic device 300. Each of the cover assembly 322 and the cover assembly 324 is coupled to a housing component 312, such as with an adhesive, a fastener, or a combination thereof. The housing component 312 may be similar to the housing components 112, 114 and 116 of FIG. 1. The housing component 312 at least partially defines an interior cavity 305 of the electronic device 300.

The cover assembly 322 includes a glass cover member 332 and the cover assembly 324 includes a glass cover member 334. The cover assembly 324 defines a protruding portion 326 (also referred to as a first portion) which protrudes with respect to a base portion 328 (also referred to as a second portion) due to the greater thickness of the glass cover member 334 in the protruding portion 326.

In a similar fashion as described for FIG. 2A, the cover assembly 324 defines an exterior surface 344. A region 346 of the exterior surface 344 is defined by the protruding portion 326 and a region 348 of the exterior surface 344 is defined by the base portion 328. The region 346 protrudes or is raised with respect to the second portion 348 and may therefore be referred to as a raised region, an offset region, or an outer region. As an example, the raised region 346 may define a plateau. A region 347 of the exterior surface 344 may extend between the region 346 and the region 348 and may define a side of the protruding portion 326. As schematically shown in FIG. 3, the region 346 may include a textured region. In the example of FIG. 3, the region 346 has a rougher texture than the region 348 or the region 347. More generally, the different regions of the exterior surface 344 may have similar textures to each other or may have different textures from each other as previously described with respect to FIG. 1B.

The electronic device 300 further includes a display 374 and a touch sensor 372 provided below the front cover assembly 322. The display 374 and the touch sensor 372 may be as previously described for FIG. 2A and, for brevity, that description is not repeated here.

The cover assembly 324 further includes a cosmetic or decorative coating 360 disposed along an interior surface 332 of the glass cover member 334. The cosmetic coating 360 may directly contact the interior surface 332. In the example of FIG. 3, the cosmetic coating 360 extends under the protruding portion 326. In some cases, the protruding portion 326 has substantially the same color as the base portion 328.

The electronic device 300 further includes a camera assembly 375. The partial cross-section view of FIG. 3 shows one optical module 377 of the camera assembly 375. The camera assembly 375 further includes a support structure 376 which is coupled to an interior of the cover assembly 324. As shown in FIG. 3, the decorative coating 360 extends between the support structure 376 and the glass cover member 334 and the support structure 376 may be coupled to the interior surface 332 through the cosmetic coating in a similar manner as previously described for support structure 276. The support structure 376 may have similar features and functions as support structure 276. The description provided with respect to support structure 276 is generally applicable herein and, for brevity, is not repeated here.

As previously described with respect to FIG. 2A, the cover assembly 324 may define a hole 337 extending through the protruding portion 326. The hole 337 may also be referred to herein as a through-hole. As shown in FIG. 3, the glass cover member 334 also at least partially defines the hole 337. The cover assembly 324 further defines an opening 367 to the hole 337. The opening 367 is located in the region 346 includes a textured region.

The optical module 377 is aligned with the through-hole 337. As shown in FIG. 3, the optical module 377 extends substantially through the through-hole 337. The optical module 377 is also positioned at least partially within the opening 367. In the example of FIG. 3, an end of the optical module 377 is substantially flush with the opening 367. In another example, the optical module 377 may extend through the opening 367 so that an end of the optical module extends beyond (is proud of) the opening and the surface region 346.

In a similar fashion as previously described with respect to FIGS. 1B and 2A, the different regions of the exterior surface 344 may have similar textures to each other or may have different textures from each other. The texture of a given region of the cover assembly 324 may result from texturing of the glass cover member 334. Different textures of the glass cover member 334 may result from using different process conditions in a single type of texturing process or may result from using different types of texturing processes. Different methods for forming textures on the glass cover member 334 are discussed with respect to FIG. 6 and those details are applicable here. Further, the discussion of surface textures provided with respect to FIG. 5 is applicable herein but, for brevity, is not repeated here.

In some cases, the cosmetic coating 360 may include a color layer (e.g., an ink, dye, paint, etc.) and/or a metal layer. The cosmetic coating is positioned underneath the base portion 328 of the cover assembly 324 and may therefore provide the base portion 328 with a desired color. The cosmetic coating may have similar feature to the cosmetic coating 260 and, for brevity, that description is not repeated here.

Figure 4:
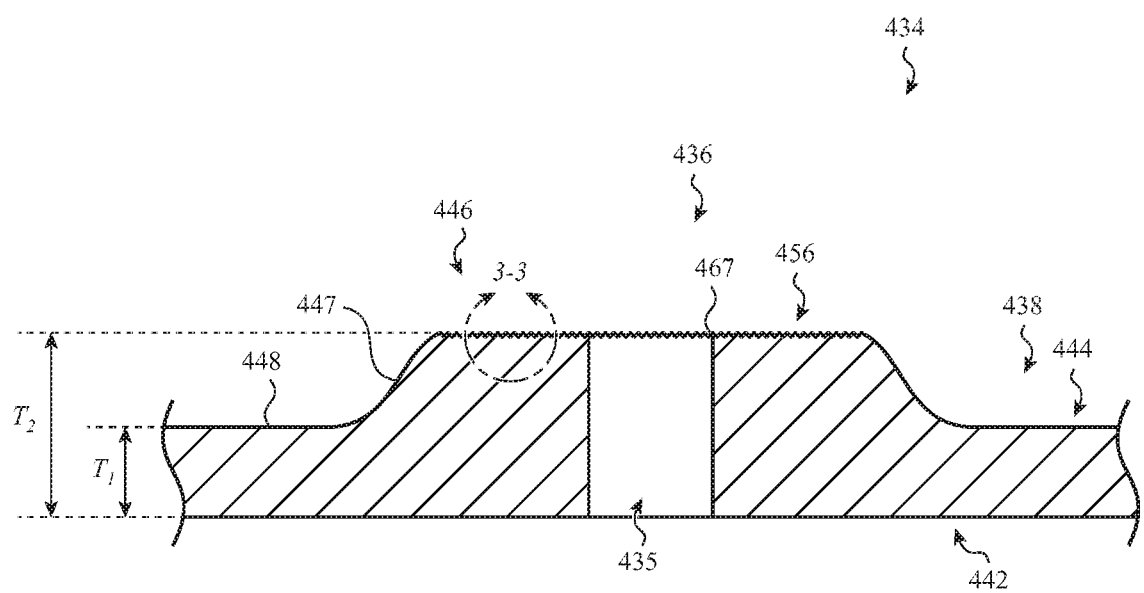
FIG. 4 shows a partial cross-section view of a textured glass cover member of an electronic device.

FIG. 4 shows a partial cross-section view of a glass cover member 434 of an electronic device. The glass cover member 434 is shown in FIG. 4 with the exterior surface 444 of the glass cover member 434 facing upwards, which is rotated with respect to the view of FIGS. 2A-2C and 3. The glass cover member 434 may be an example of the glass cover member 134 of FIG. 1B. As shown in FIG. 4, the glass cover member 434 defines a base portion 438 and protruding portion 436 (also referred to as a protrusion), which protrudes or is at least partially offset with respect to the base portion 438. The thickness $T_2$ of the protruding portion is greater than the thickness $T_1$ of the base portion 438. As examples, the ratio $T_2/T_1$ may be from about 1.25 to about 3 or from about 1.5 to about 2. In some cases, the protruding portion 436 has a thickness greater than about 1 mm and less than or equal to about 2 mm and the base portion 438 has a thickness greater than about 0.5 mm and less than about 1 mm.

As shown in FIG. 4, the exterior surface 444 of the glass cover member 434 includes a base portion 448 defined by the base portion 438 of the glass cover member 434. The exterior surface 444 further includes a raised region 446 and a side region 447 defined by the protruding portion 436. The raised region 446 may also be referred to as an offset region, as an outer region, or as a central region (of the protruding portion 436). The raised region 446 is offset with respect to the base region 448 of the exterior surface 444. In particular, the raised region 446 protrudes outwards, away from the interior cavity of the electronic device. The raised region 446 may define a plateau.

As shown in FIG. 4, the protruding portion 436 of the glass cover member 434 may further define a through-hole, such as the through-hole 435. The through-hole 435 may allow input to, output from, or placement of a device component such as an optical module as previously described with respect to FIGS. 1B, 2A, and 3. The protruding portion 436 may further define an opening 467 to the through-hole, with the opening 467 being located in the textured region 456. In some cases, the protruding portion 436 may define an arrangement, array, or set of through-holes and openings extending through the protruding portion 436. For example, the glass cover member 434 may define any number of through-holes and openings, such as one, two, three, four, or five through-holes and openings.

The glass cover member 434 may be of unitary construction. For example, the glass cover member 434 may be formed from a single piece of a glass material to define a monolithic glass component. The protrusion 436 may be formed into the glass cover member 434 by a molding or a slumping process to define the protruding profile shape. The protrusion 436 may also be formed into the glass cover member 434 by machining away material around the portion of the glass cover member 434 that is to become the protrusion 436. In some cases, the exterior surface of the glass cover member 434 formed by an initial shaping process may be ground, polished, or otherwise processed to achieve the desired surface finish(es) as described further with respect to FIG. 6.

As shown in FIG. 4, the raised region 446 of the exterior surface 444 includes a textured region 456. The textured region 456 may extend across a substantial entirety of the raised region 446 except for the opening(s) such as 467. For example, the textured region 456 may extend substantially across the plateau defined by the raised region 446 and in some cases may be confined to the plateau. In some cases, the textured region 456 of the raised region 446 may be configured to produce a gloss level which is lower than that of a window or lens of an optical module in the opening 467 (e.g., the window 269 of FIG. 2A). The textured region 456 may also be configured to produce a translucent and/or hazy appearance.

In some embodiments, the base region 448 and/or the side region 447 of the exterior surface 444 is also textured. In general, each of the various textured regions of the glass cover member 434 may have similar textures to each other or may have different textures from each other. Different textures may result from using different process conditions in a single type of texturing process or may result from using different types of texturing processes. In some embodiments, a textured region of the glass cover member 434 may have a texture formed by overlap of two different textures. Such a texture may result from using two different texturing processes to create the textured region.

In one example, the base region 448 and the raised region 446 may both define respective textured regions of the exterior surface 444 (also referred to herein as textured surface regions). For example, the raised region 446 may define a first texture and the base region 448 may define a second texture different than the first texture, as was previously illustrated with respect to FIGS. 2A-2C. In some cases, the side region 447 (which may also be referred to as a peripheral region) may define a third texture. As examples, the third texture may be the same as the first texture or the second texture or may be formed by an overlap of the first texture and the second texture. As used herein, a texture may include a relatively smooth texture, such as a texture produced by a polishing process.

As schematically illustrated in FIG. 4, the texture of the textured region 456 (of the raised region 446) may be rougher than the texture of the base region 448. For example, the textured region 456 may have at least one roughness parameter, such as a root mean square surface height, a root mean square slope, and/or a mean peak curvature, which is greater than that of the base region 448. In some cases, the base region 448 may not include a textured region or may have a smooth texture that is tactilely and/or visually distinct from that of the textured region 456. For example, the base region 448 may have a relatively smooth texture resulting from a polishing or a glass forming process, such as a texture corresponding to that of a polished surface.

In addition, the side region 447 may have a texture which is smoother than that of the textured region 456. In some cases, the side region 447 may have a texture similar to that of the base region 448, such as a texture corresponding to that of a polished surface. In some cases, the textured region 456 may not substantially extend along the side region 447, so that the raised region 446 and the side region 447 are visually distinct.

In additional examples, the texture of the textured region 456 (of the raised region 446) may be configured to produce a similar visual effect to the texture of the base region 448. The side region 447 may also define a texture configured to produce a similar effect to the texture(s) of the raised region 446 and the base region 448 in order to provide visual continuity between the base region 448, the side region 447, and the raised region 446. For example, the texture(s) of the base region 448, the side region 447, and the raised region 446 may be configured to produce a hazy effect and may have a relatively high value of transmissive haze.

FIG. 5 shows a detail view of a textured region 556 of a glass cover member 534. The textured region 556 may be an example of the textured region 456 of FIG. 4 in detail area 3-3. The textured region 556 may be defined by a raised region 546 of the exterior surface of the glass cover member 534, as previously described with respect to FIG. 4, and may also be referred to herein as a textured surface region.

The textured region 556 comprises a plurality of surface features 580. The example of the surface features 580 provided in FIG. 5 is not limiting and in general the surface features 580 of a surface region of the glass cover member 534 may define any of a range of shapes or configurations. The surface features 580 may have a variety of shapes, such as rounded or angular features. As examples, the surface features 580 may define a circular, oval, polygonal, rectangular, or irregular surface contour. Furthermore, the surface features 580 may define protrusions, recesses, or a combination thereof and may have any suitable shape and may be pyramidal, conical, cylindrical, arched, have a curved upper surface or a frustum of a shape such as a cone, and so on.

As shown in FIG. 5, the surface features 580 may define one or more recesses, such as the surface feature 584. A recess may define a minimum point, such as the point 585. The surface features 580 may also define one or more protrusions, such as the surface feature 586. A protrusion may define a maximum point, such as the point 587. As schematically shown in FIG. 5, the surface features 580 may define a set of minimum points as well as a set of maximum points. The set of maximum points may also be referred to as a set of peaks. The surface features 580 may define a set of recesses, each recess being positioned between adjacent peaks of the set of peaks. The shapes of the peaks and the valleys are not limited to those schematically shown in FIG. 5. For example, at least some of the peaks may have a somewhat larger radius of curvature (and smaller curvature) as shown in FIG. 2B to provide the desired tactile properties in addition to the desired level of cleanability for the textured surface.

In some embodiments, the surface features 580 define a set of hills and valleys. The hills and valleys may be defined using areal texture analysis techniques as described below. The surface feature 586 may generally correspond to a hill feature and the surface feature 584 may generally correspond to a valley feature. In some embodiments, a set of hills and valleys has a substantially uniform spacing between hill features, valley features, or a combination thereof. In additional embodiments, a set of valleys may have a non-uniform or an irregular spacing between hill features and/or valley features.

The heights of the surface features 580 may be measured with respect to a reference surface 582. For example, the heights of the hills may be determined from the maximum points (e.g., point 587) and the heights of the valleys may be determined from the minimum points (e.g., point 585). The glass cover member 534 may be an example of glass cover member 234 or any other glass cover members described herein. Details of these glass cover members are applicable to the glass cover member 534 and, for brevity, will not be repeated here.

In some cases, the textured region 556 may be a mechanically textured region and the surface features 580 may be formed by one or more mechanical grinding and polishing applications. For example, the surface features 580 may result at least in part from brittle fracture of the glass during the grinding and/or polishing process. Surface features resulting from brittle fracture may be more angular than those resulting from ductile fracture or etching. For example, peaks and/or valleys of the texture may be more pointed and/or contain more distinct edges than those resulting from ductile fracture or etching. Further description of operations for forming surface features is provided with respect to FIG. 6 and, for brevity, is not repeated here.

The surface features 580 may be configured to provide particular optical properties to one or more surface regions of the glass cover member 534, as well as to a cover assembly and electronic device including the glass cover member 534. However, the surface features 580 defining the texture of the surface region may not be individually visually perceptible. In some cases, the texture of the surface region may cause the glass cover member 534 to appear translucent, rather than transparent. In some cases, the texture may be configured to provide particular levels of such optical properties such as transmissive haze, clarity, gloss, graininess, and combinations thereof.

A textured surface region of the glass cover member, such as the textured region 556, may be configured to provide a specified gloss level to the surface. In some embodiments, the textured region 556 may have a gloss value of less than about 50 gloss units, less than about 40 gloss units, from 5 gloss units to 50 gloss units, from 10 gloss units to 50 gloss units, from 10 gloss units to 45 gloss units, or from 15 gloss units to 45 gloss units as measured at 60 degrees. The gloss level may be measured in the absence of a cosmetic coating.

The gloss value of another region of the exterior surface of the glass cover member, such as the base region, may be similar to or different from that of the textured region 556. For example, the other region of the exterior surface may have a higher gloss than the textured region 556, such as when the other region has a smoother surface. As another example, the other region of the exterior surface may have a lower gloss than the textured region 556. For example, the gloss of the other region may be less than about 20 gloss units, less than about 15 gloss units, less than about 10 gloss units, from 5 gloss units to 20 gloss units, or from 10 gloss units to 20 gloss units as measured at 60 degrees. The difference between the gloss of the textured region and the other region may be at least 10% and less than 100% or at least 10% and less than 50%. In some cases, the gloss of the textured region may be measured using commercially available equipment and according to ASTM or ISO standard test methods. The angle measurement may refer to the angle between the incident light and the perpendicular to the textured region of the surface.

A textured surface region of the glass cover member, such as the textured region 556, may be configured to provide a specified level of transmissive haze to the corresponding portion of the glass cover member. In some cases, the transmissive haze of the textured region may be measured using commercially available equipment and according to ASTM or ISO standard test methods. The transmissive haze may relate to the amount of light subject to wide angle scattering (e.g., greater than 2.5 degrees). The transmissive haze may be greater than or equal to about 50%, greater than or equal to about 60%, or greater than or equal to about 70%. For example, the transmissive haze may be from about 60% to about 90% or from about 70% to about 80%. As non-limiting examples, the transmissive haze may be measured using a haze-gard i device available from BYK or a GC 5000L variable photometer available from Nippon Denshoku. The transmissive haze scattering may be measured for the cover assembly or glass cover member as removed from the electronic device. The transmissive haze of another region of the exterior surface of the glass cover member, such as the base region, may be similar to or different from that of textured region 556. For example, the other region of the exterior surface may have a lower amount of transmissive haze than the textured region 556, such as less than 50%, less than 40%, less than 30%, or less than 25%.

A textured surface region of the glass cover member, such as the textured region 556, may be configured to provide a specified level of clarity to the corresponding portion of the glass cover member. The clarity or the transmissive narrow angle scattering of the textured region may be measured using commercially available equipment and according to ASTM or ISO standard test methods. The clarity may be less than about 50%, less than about 40%, less than about 30%, less than about 20%, less than about 15%, or less than about 10%. For example, the clarity may be from about 5% to about 30%, from about 5% to about 20%, from about 5% to about 15%, or from about 5% to about 15%. The transmissive narrow angle scattering may be measured using a haze-gard i device available from BYK or a GC 5000L variable photometer available from Nippon Denshoku. A clarity value may be determined from measurements of the intensity in a central region ($I_{central}$) and an intensity in a ring around the central region ($I_{ring}$). For example, the clarity value may be equal to $100\%*(I_{central}-I_{ring})/(I_{central}+I_{ring})$. The clarity or the transmissive narrow angle scattering may be measured for the cover assembly or glass cover member as removed from the electronic device.

In some cases, a textured region of the glass cover member may be configured to provide a specified level of visual uniformity to the corresponding portion of the glass cover member. The level of visual uniformity of another region of the exterior surface of the glass cover member, such as the base region, may be similar to or different from that of textured region 556. The graininess of a textured region may be measured under diffused illumination using commercially available equipment. The graininess may be measured similarly for a textured region of a cover assembly. In some cases, an image of the textured surface of the glass cover member 534 may be obtained using a digital camera and the lightness of each pixel of the image may be determined, thereby allowing determination of the lightness variation across the textured surface. For example, the BYK-mac device available from BYK may produce a graininess value determined from a histogram of the lightness levels. The graininess of the textured surface may be less than about 1.5 or less than about 1.0. In addition, the graininess may be from about 0.1 to about 1.5, from about 0.1 to about 1.0, from about 0.25 to about 1.5, from about 0.25 to about 1.0, from about 0.5 to about 1.5, or from about 0.5 to about 1.0. These graininess values may be measured prior to application of any cosmetic coating to the glass cover member.

A textured surface region of the glass cover member, such as the textured region 556, may be configured to provide a specified level of cleanability. For example, the texture of the textured region 556 may be configured so that a root mean square (RMS) height of the features is not overly large. The texture may also be configured so that a size of any recessed surface features is sufficiently large to facilitate cleaning. In addition, the texture may be configured so that the root mean square (RMS) slope and/or the mean peak curvature of the surface features is small enough to provide the desired tactile properties in addition to the desired level of cleanability.

Surface texture parameters include areal surface texture parameters such as amplitude parameters, spatial parameters, and hybrid parameters. Surface filtering may be used to exclude surface noise and/or surface waviness before determining the surface texture parameters. In addition, a segmentation technique may be used to determine feature parameters such as the maximum diameter, the minimum diameter, the area, and the perimeter. These parameters may be calculated on the basis of the feature shape as projected onto the reference surface (e.g., a reference plane). Mean values may be determined for a given class of surface features (e.g., hills or valleys). Surface texture parameters and methods for determining these parameters (including filtering and segmentation) are described in more detail in International Organization for Standardization (ISO) standard 25178 (Geometric Product Specifications (GPS)—Surface texture: Areal). These surface texture parameters may be measured using commercially available equipment.

For example, the surface features 580 of one or more surface regions of the glass cover member 534 may be characterized, in part, by the heights of the surface features. The height may be measured with respect to a reference surface, such as the arithmetical mean of the surface (schematically shown by line 582 in FIG. 5). The heights of the surface features 580 may not be uniform, so that the surface features have a distribution of heights. The magnitude of the heights of the surface features 580 may fall in the range from zero to about 5 microns, zero to about 2.5 microns, from zero to about 2 microns, from zero to about 1.5 microns, or from zero to about 1 micron. The surface features 580 may be characterized by the root mean square height Sq or the arithmetic mean height Sa of the surface. The root mean square (RMS) height of the surface features 580 may be greater than zero and less than about 2.5 microns, greater than zero and less than about 2 microns, greater than zero and less than about 1.5 microns, greater than zero and less than about 1 micron, from about 0.1 microns to about 2.5 microns, from about 0.1 microns to about 2 microns, from about 0.1 microns to about 1.5 microns, from about 0.1 microns to about 1.25 microns, from about 0.1 microns to about 1.0 micron, from about 0.2 microns to about 2.5 microns from about 0.2 microns to about 2 microns, from about 0.2 microns to about 1.5 microns, from about 0.2 microns to about 1.25 microns, from about 0.2 microns to about 1.0 micron, from about 0.25 microns to about 2.5 microns, from about 0.25 microns to about 2 microns, from about 0.25 microns to about 1.5 microns, from about 0.25 microns to about 1.25 microns, from about 0.25 microns to about 1.0 micron, from about 0.5 microns to about 2.5 microns, from about 0.5 microns to about 2 microns, from about 0.5 microns to about 1.5 microns, from about 0.5 microns to about 1.25 microns, or from about 0.5 microns to about 1.0 micron. In some cases, one textured region may be referred to as being rougher than another textured region when it has a greater RMS height.

The RMS height of another region of the exterior surface of the glass cover member, such as the base region, may be similar to or different from that of textured region 556. For example, the RMS height of the raised region may be greater than that of the base region. For example, the RMS height of the raised region may be at least 10% and less than 150%, at least 10% and less than 100%, or at least 10% and less than 50% greater than that of the base region. In some cases, the RMS height of the base region may be similar to that of a polished surface, such as from about 1 nm to about 150 nm, from about 1 nm to about 125 nm, from about 1 nm to about 100 nm, from about 1 nm to about 75 nm, from about 1 nm to about 50 nm, from about 1 nm to about 25 nm, or from 1 nm to about 10 nm.

In addition, the surface features 580 of one or more surface regions may be characterized by lateral parameters, such as the distance between peaks. The spacing between peaks may not be uniform, so that there is a distribution of spacings between peaks. The average (mean) distance or spacing between peaks may be referred to as the average pitch or mean pitch. The average pitch may be from about 1 micron to about 20 microns, from about 1 micron to about 15 microns, from about 1 micron to about 10 microns, from about 2.5 microns to about 20 microns, from about 2.5 microns to about 15 microns, from about 2.5 microns to about 10 microns, from about 5 microns to about 20 microns, from about 5 microns to about 15 microns, or from about 5 microns to about 10 microns.

In some embodiments, the surface features 580 of one or more surface regions may be configured so to have a particular ratio of the average height of the peaks to the average spacing of the peaks. For example, the ratio of the RMS height to the mean pitch may be from about 0.01 to about 0.6, from about 0.01 to about 0.3, from about 0.02 to about 0.6, from about 0.02 to about 0.3, from about 0.03 to about 0.6, from about 0.03 to about 0.3, from about 0.04 to about 0.6, or from about 0.04 to about 0.3.

The surface features 580 of one or more surface regions may also be characterized by a lateral size. For example, the surface features 580 may be characterized by a maximum lateral (or linear) size and a minimum lateral (or linear size). The surface features 580 may have a maximum lateral size small enough that they are not visually perceptible as individual features. In addition, the lateral size and spacing of the surface features 580 may be configured so that the glass cover member has a sufficiently low level of graininess.

The surface features 580 of one or more surface regions may be characterized by the root mean square slope (Sdq), also referred to as the root mean square gradient. In some embodiments, the root mean square slope may be greater than zero and less than about 1.25, greater than zero and less than about 1, from 0.1 to less than about 1.25, from about 0.1 to less than about 1, from about 0.25 to less than about 1, from about 0.25 to about 0.75, or from about 0.1 to about 0.5. In some cases, the root mean square slope of the raised region is greater than that of the base region. For example, the root mean square slope of the raised region may be at least 10% and less than 60% greater than that of the base region.

The surface features 580 of one or more surface regions may also be characterized by the curvature of the peaks (also referred to as summits), such as by the arithmetic mean summit curvature $S_{sc}$, also referred to herein as the mean peak curvature. In some embodiments, the arithmetic mean summit curvature is greater than zero and less than about 2.0 microns, greater than zero and less than or equal to about 1.5 microns$^{-1}$, from about 0.1 microns$^{-1}$ to about 2.0 microns$^{-1}$, from about 0.1 microns$^{-1}$ to about 1.5 microns$^{-1}$, from about 0.25 microns$^{-1}$ to about 2.0 microns$^{-1}$, from about 0.25 microns$^{-1}$ to about 1.5 microns$^{-1}$, from about 0.5 microns$^{-1}$ to about 2.0 microns$^{-1}$, from about 0.5 microns$^{-1}$ to about 1.5 microns$^{-1}$ from about 0.75 microns$^{-1}$ to about 2.0 microns$^{-1}$, or from about 0.75 microns$^{-1}$ to about 1.5 microns$^{-1}$. In some cases, the mean peak curvature of the raised region is greater than that of the base region. For example, the mean peak curvature of the raised region may be at least 10% and less than 50% greater than that of the base region.

The surface features 580 of one or more surface regions may also be characterized by an autocorrelation length. In some embodiments, the autocorrelation length is from about 1 micron to about 50 microns, from about 2 microns to about 30 microns, or from about 3 microns to about 25 microns.

As previously described with respect to FIGS. 2A and 3, a cosmetic coating may be disposed along an interior surface of the glass cover member 535. In some cases, the surface features 580 of the glass cover member 534 may be configured to minimize less desirable visual effects when the cosmetic coating is viewed through a textured region, such as the textured region 536. For example, it may be preferred that the texture does not produce an undesirable amount of visual contrast variation and/or a visual texture.

Figure 6:
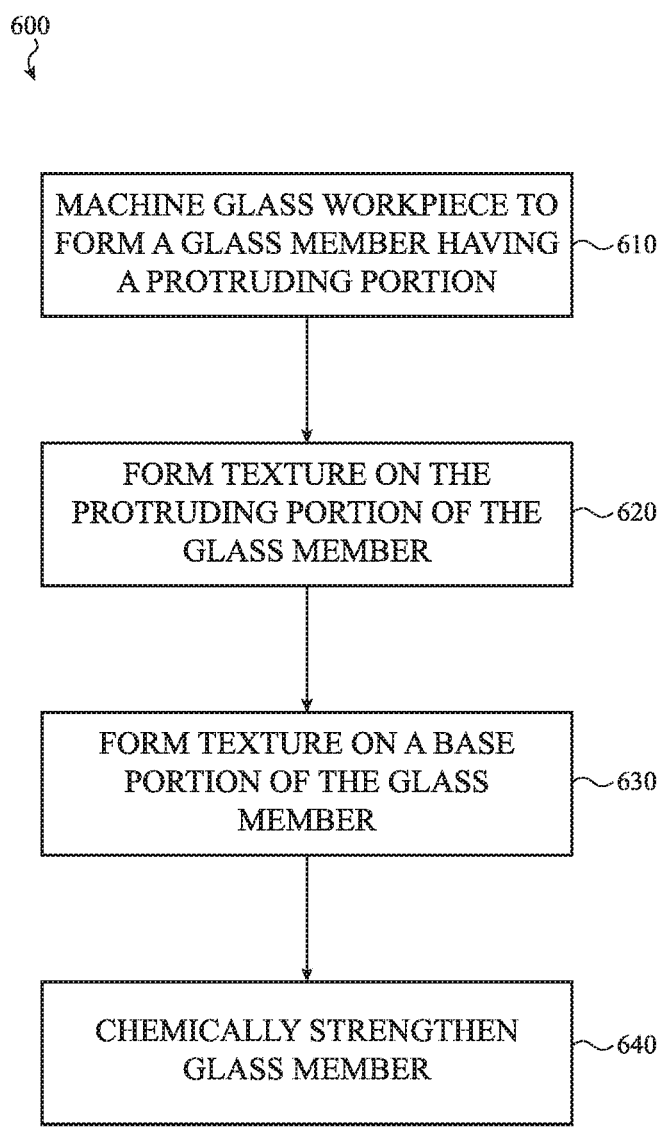
FIG. 6 shows a flow chart of an example process for forming a textured glass cover component.

FIG. 6 shows a flow chart of an example process 600 for forming a textured glass component, such as a glass cover member. The textured glass component may be formed from a workpiece or blank of a glass material. The process 600 includes an operation 610 of machining a glass workpiece to form a glass member having a protruding portion, operations 620 and 620 of forming a texture (other than the as-machined texture) on the protruding portion and a base portion of the glass member, and an operation 630 of chemically strengthening the glass member.

Typically, the glass material of the workpiece and the member includes a silica-based glass material. The glass material of the glass cover member may have a network structure, such as a silicate-based network structure. In some embodiments, the glass material includes an aluminosilicate glass. As used herein, an aluminosilicate glass includes the elements aluminum, silicon, and oxygen, but may further include other elements. Typically, the glass material includes an ion-exchangeable glass material, such as an alkali metal aluminosilicate glass (e.g., a lithium aluminosilicate glass). An ion-exchangeable aluminosilicate glass may include monovalent or divalent ions which compensate for charges due to replacement of silicon ions by aluminum ions. Suitable monovalent ions include, but are not limited to, alkali metal ions such as $Li^+$, $Na^+$, or $K^+$. Suitable divalent ions include alkaline earth ions such as $Ca^{2+}$ or $Mg^{2+}$. The description of suitable glass materials provided with respect to FIG. 6 is generally applicable to the glass components and cover members described herein.

As shown in FIG. 6, the process 600 includes an operation 610 of machining a glass workpiece or blank to a desired shape. In some cases, the operation 610 removes glass material from the workpiece or blank to define a glass member having protruding portion and a base portion. For example, the operation 610 may include removing glass around the portion of the workpiece that is to become the protruding portion. In some cases, this portion of the operation 610 may be omitted when the protruding portion is formed via a molding operation. The operation 610 may further include drilling one or more through-holes in the protruding portion. The operation 610 may involve one or more of a computer numerical control (CNC) machining process such as a CNC milling process, a CNC grinding process, and/or a CNC drilling process. In some cases, the protruding portion (e.g., the protruding portion 436) has a thickness greater than about 1 mm and less than or equal to about 3 mm and the base portion 438 has a thickness greater than about 0.5 mm and less than about 2 mm after operation 610. Optionally, the glass member may be washed following the operation 610.

The process 600 further includes an operation 620 of forming a texture on the protruding portion of the glass member. The operation 620 may include using a mechanical treatment to mechanically remove glass material from the protruding portion of the glass member. Mechanical treatments include grinding operations, polishing operations, or combinations thereof. Typically the operation 620 involves removing glass material from the surface of the protruding portion using particles of an abrasive material, such cubic boron nitride, diamond, or silicon carbide. When the operation 620 involves multiple mechanical treatment steps, the earlier steps typically use a coarser abrasive than the later steps. The grinding operation may be CNC grinding process using a fixed abrasive material (e.g., metal or resin bonded to the grinding tool). The polishing operation may use a loose abrasive material, which may be supplied in a slurry to a polishing pad. In some cases, a polishing operation may have a polishing depth (the depth of the glass material removed) which is less than the full height of the surface features resulting from a previous grinding or polishing operation. In some cases, the operation 620 may produce a texture on a raised region of the protruding portion (e.g., a region similar to region 446 in FIG. 4). Optionally, the glass member may be washed following the operation 620.

The process 600 further includes an operation 630 of forming a texture on the base portion of the glass member. In some cases, the operation 630 is different than the operation 620. For example, the operation 630 may use a different technique than the operation 620 in forming the texture of the base portion. In some cases, the operation 630 may also produce a texture on a side or peripheral region of the protruding portion (e.g., a region similar to region 447 of FIG. 4). Further, in some cases the operation 630 may texture both the base and the protruding portion of the member and then the operation 620 may further texture the protruding portion of the member. Optionally, the glass member may be washed following the operation 630.

In some embodiments, the operation 630 may include a sequence of mechanical removal steps to remove glass material from the surface of the base portion. In some cases, the final step in the sequence may produce a smoother texture than the texture produced by the operation 620. For example, the final mechanical removal step of the operation 630 may use a finer abrasive and/or apply lesser force than is used in the operation 620. In some cases, operation 630 produces a texture corresponding to that of a polished surface.

In some cases, the operation 630 may include a mechanical removal step followed by an etching step. For example, the mechanical removal step may involve directing a stream of abrasive particles at the base portion using a wet or dry grit blasting process. Following the grit blasting, a chemical etching technique may be used to further remove glass material from the glass member. Some or all of the protruding portion of the glass may be shielded using a mask, such as a wax or polymer mask, during the operation 630. The chemical etching may occur in the liquid phase or in a gas phase. Etching techniques also include reactive ion etching, which may use a mixture of a fluorine containing compound such as $CH_4$, $CHF_3$, $SF_6$ and the like in a gas such as argon or xenon. The etch treatment may etch the glass cover member to a sufficient depth to remove at least some of the small pits, small fissures, or other such features formed during grit blasting.

Other techniques for removing a portion of the glass cover member which may be used in the operation 630 include, but are not limited to, chemical etching, mechanical removal of material such as abrasive treatment, laser ablation, lithography in combination with etching, and combinations thereof. In some cases, a laser ablation technique may involve multiple operations of directing a sequence of laser pulses onto a surface of the glass member.

The process 600 further includes an operation 640 of chemically strengthening the glass member. In some cases, the operation 640 may take place after the operation 620 and the operation 630 have been completed. In other cases, the operation 640 may take place prior to the final mechanical treatment step (e.g., a polishing step) of the operation 620 and/or the operation 630 has been completed.

Figure 7:
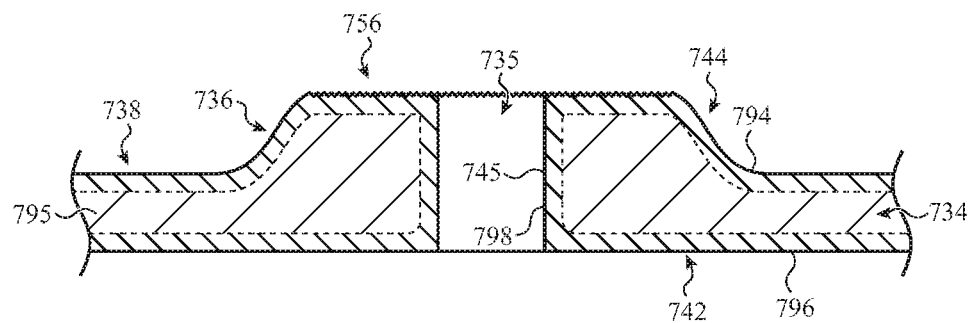
FIG. 7 schematically shows a textured glass cover member after chemical strengthening.
Figure 8:
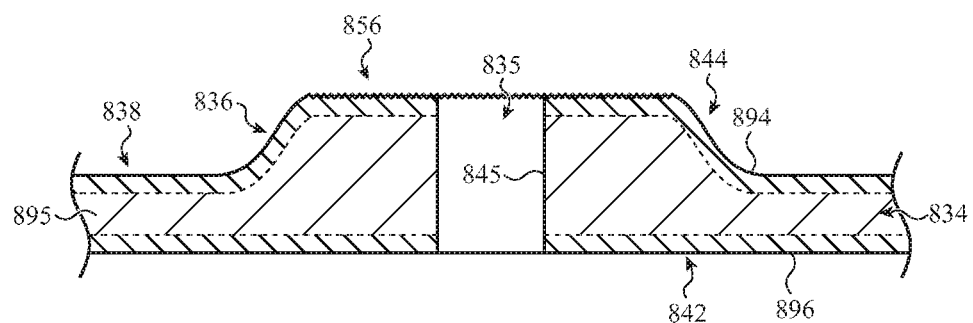
FIG. 8 schematically shows an additional textured glass cover member after chemical strengthening.

The operation 640 may include an ion exchange operation which chemically strengthens the glass cover member. During the ion exchange operation, ions present in the glass material can be exchanged for larger ions in a region extending from a surface of the glass cover member. The ion exchange may form a compressive stress layer extending from a surface of the glass cover member, as schematically illustrated in FIGS. 7 and 8. In some cases, the operation 640 includes multiple ion exchange operations. In some embodiments, a compressive stress layer is formed at each of the textured exterior surface and the interior surface of the glass cover member. A tensile stress layer may be formed between these compressive stress layers.

For example, an ion-exchangeable glass material of the glass member may include monovalent or divalent ions such as alkali metal ions (e.g., $Li^+$, $Na^+$, or $K^+$) or alkaline earth ions (e.g., $Ca^{2+}$ or $Mg^{2+}$) which may be exchanged for other alkali metal or alkaline earth ions. If the glass member comprises sodium ions, the sodium ions may be exchanged for potassium ions. Similarly, if the glass member comprises lithium ions, the lithium ions may be exchanged for sodium ions and/or potassium ions. In some embodiments, the compressive stress layer extends to a depth (or thickness) in the glass member which is greater than a lowest depth of the surface texture.

In an example, the chemical strengthening process involves exposing the glass member to a medium containing the larger ion, such as by immersing the glass member in a bath containing the larger ion or by spraying or coating the glass member with a source of the ions. For example, a salt bath comprising the ion of interest (e.g., a potassium nitrate bath) may be used for ion exchange. Suitable temperatures for ion exchange are above room temperature and are selected depending on process requirements. The ion exchange process may be conducted at a temperature below the strain point of the glass. The glass member may be cooled following the ion exchange operation. Depending on the factors already discussed above, a compression layer as deep as about 10-250 microns can be formed in the glass member. The surface compressive stress (CS) may be from about 300 MPa to about 1100 MPa. A mask can be used to shield portions of the glass member from ion exchange as desired. Optionally, the glass member is washed after the ion exchange operation 640.

In some embodiments, the operations of the process 600 may be performed in a different order than shown in FIG. 6. For example, some or all of the operation 630 may precede some or all of the operation 620, so that the base portion of the member may be at least partially textured before the protruding portion. Further, an operation of forming one or more though holes in the glass member may occur after one or more of the steps of operations 620 and/or 630. In addition, process 600 may include one or more additional operations. For example, the process 600 may include a separate or additional operation of forming a texture on a side or peripheral region of the protruding portion of the member. In addition, the process 600 may include a washing operation, a polishing operation, and/or a coating operation.

FIG. 7 schematically shows a glass cover member 734 after a chemical strengthening operation. The glass cover member 734 includes a protruding portion 736, a base region 738, and a textured region 756. As shown in FIG. 7, a compressive stress layer 794 extends from the exterior surface 744 and a compressive stress layer 796 extends from the interior surface 742 of the glass cover member 734 (not shown to scale). The compressive stress layer 794 may therefore be referred to as an exterior compressive stress layer and the compressive stress layer 796 may therefore be referred to as an interior compressive stress layer. The tensile stress layer 795 is positioned between the compressive stress layers 794 and 796. In the example of FIG. 7, the compressive stress layer 794 has substantially the same depth as the compressive stress layer 796. However, this example is not limiting and in some cases the depth of the compressive stress layer 794 may be different from that of the compressive stress layer 796. For example, the depth of the compressive stress layer 794 may be substantially greater than that of the compressive stress layer 796.

As examples, the depth of the compressive stress layer 794 may be from 75 microns to 250 microns, from 100 microns to 250 microns, or from 125 microns to 250 microns. In some cases, a compressive stress layer (e.g., 794, 796, or 798) may have a depth greater than the depth of any subsurface features remaining from the texturing process. The depth of the compressive stress layer 796 may be the same as that of the compressive stress layer 794 or may be from about 5 microns to about 100 microns or from about 5 microns to about 50 microns.

As shown in FIG. 7, the glass cover member 734 also includes a compressive stress layer 798 extending from a wall surface 745 defining a through-hole 735. For example, the compressive stress layer 798 may be formed when the through-hole 735 is formed prior to a chemical strengthening operation. The compressive stress layer may have a depth substantially the same as that of the compressive stress layer 794 or 796, or may have some other depth. The glass cover member 734 may be an embodiment of the glass cover member 134 of FIG. 1B or any other glass cover member described herein.

FIG. 8 schematically shows a glass cover member 834 after a chemical strengthening operation. The glass cover member 834 includes a protruding portion 836, a base region 838, and a textured region 856. As shown in FIG. 8, a compressive stress layer 894 extends from the exterior surface 844 and a compressive stress layer 896 extends from the interior surface 842 of the glass cover member 834 (not shown to scale). The tensile stress layer 895 is positioned between the compressive stress layers 894 and 896. In the example of FIG. 8, the compressive stress layer 894 has substantially the same depth as the compressive stress layer 896. However, this example is not limiting and in some cases the depth of the compressive stress layer 896 may be different from that of the compressive stress layer 894. For example, the depth of the compressive stress layer may be substantially greater than that of the compressive stress layer 894. The depths of the compressive stress layers may be as previously described for FIG. 7 and for brevity that description is not repeated here.

As shown in FIG. 8, the glass cover member 834 does not include a compressive stress layer extending from a wall surface defining the through-hole 835. In some cases, a masking operation may be used to prevent ion exchange along this wall surface. The glass cover member 834 may be an embodiment of the glass cover member 134 of FIG. 1B or any other glass cover member described herein.

FIG. 9 shows a block diagram of a sample electronic device that can incorporate a textured glass component, such as a textured glass cover member. The schematic representation depicted in FIG. 9 may correspond to components of the devices depicted in FIGS. 1A-8 as described above. However, FIG. 9 may also more generally represent other types of electronic devices with cover assemblies as described herein.

In embodiments, an electronic device 900 may include sensors 920 to provide information regarding configuration and/or orientation of the electronic device in order to control the output of the display. For example, a portion of the display 908 may be turned off, disabled, or put in a low energy state when all or part of the viewable area of the display 908 is blocked or substantially obscured. As another example, the display 908 may be adapted to rotate the display of graphical output based on changes in orientation of the device 900 (e.g., 90 degrees or 180 degrees) in response to the device 900 being rotated.

The electronic device 900 also includes a processor 906 operably connected with a computer-readable memory 902. The processor 906 may be operatively connected to the memory 902 component via an electronic bus or bridge. The processor 906 may be implemented as one or more computer processors or microcontrollers configured to perform operations in response to computer-readable instructions. The processor 906 may include a central processing unit (CPU) of the device 900. Additionally, and/or alternatively, the processor 906 may include other electronic circuitry within the device 900 including application specific integrated chips (ASIC) and other microcontroller devices. The processor 906 may be configured to perform functionality described in the examples above.

The memory 902 may include a variety of types of non-transitory computer-readable storage media, including, for example, read access memory (RAM), read-only memory (ROM), erasable programmable memory (e.g., EPROM and EEPROM), or flash memory. The memory 902 is configured to store computer-readable instructions, sensor values, and other persistent software elements.

The electronic device 900 may include control circuitry 910. The control circuitry 910 may be implemented in a single control unit and not necessarily as distinct electrical circuit elements. As used herein, "control unit" will be used synonymously with "control circuitry." The control circuitry 910 may receive signals from the processor 906 or from other elements of the electronic device 900.

As shown in FIG. 9, the electronic device 900 includes a battery 914 that is configured to provide electrical power to the components of the electronic device 900. The battery 914 may include one or more power storage cells that are linked together to provide an internal supply of electrical power. The battery 914 may be operatively coupled to power management circuitry that is configured to provide appropriate voltage and power levels for individual components or groups of components within the electronic device 900. The battery 914, via power management circuitry, may be configured to receive power from an external source, such as an alternating current power outlet. The battery 914 may store received power so that the electronic device 900 may operate without connection to an external power source for an extended period of time, which may range from several hours to several days.

In some embodiments, the electronic device 900 includes one or more input devices 918. The input device 918 is a device that is configured to receive input from a user or the environment. The input device 918 may include, for example, a push button, a touch-activated button, capacitive touch sensor, a touch screen (e.g., a touch-sensitive display or a force-sensitive display), capacitive touch button, dial, crown, or the like. In some embodiments, the input device 918 may provide a dedicated or primary function, including, for example, a power button, volume buttons, home buttons, scroll wheels, and camera buttons.

The device 900 may also include one or more sensors 920, such as a force sensor, a capacitive sensor, an accelerometer, a barometer, a gyroscope, a proximity sensor, a light sensor, or the like. The sensors 920 may be operably coupled to processing circuitry. In some embodiments, the sensors 920 may detect deformation and/or changes in configuration of the electronic device and be operably coupled to processing circuitry which controls the display based on the sensor signals. In some implementations, output from the sensors 920 is used to reconfigure the display output to correspond to an orientation or folded/unfolded configuration or state of the device. Example sensors 920 for this purpose include accelerometers, gyroscopes, magnetometers, and other similar types of position/orientation sensing devices. In addition, the sensors 920 may include a microphone, acoustic sensor, light sensor, optical facial recognition sensor, or other types of sensing device.

In some embodiments, the electronic device 900 includes one or more output devices 904 configured to provide output to a user. The output device 904 may include display 908 that renders visual information generated by the processor 906. The output device 904 may also include one or more speakers to provide audio output. The output device 904 may also include one or more haptic devices that are configured to produce a haptic or tactile output along an exterior surface of the device 900.

The display 908 may include a liquid-crystal display (LCD), a light-emitting diode (LED) display, an LED-backlit LCD display, an organic light-emitting diode (OLED) display, an active layer organic light-emitting diode (AMOLED) display, an organic electroluminescent (EL) display, an electrophoretic ink display, or the like. If the display 908 is a liquid-crystal display or an electrophoretic ink display, the display 908 may also include a backlight component that can be controlled to provide variable levels of display brightness. If the display 908 is an organic light-emitting diode or an organic electroluminescent-type display, the brightness of the display 908 may be controlled by modifying the electrical signals that are provided to display elements. In addition, information regarding configuration and/or orientation of the electronic device may be used to control the output of the display as described with respect to input devices 918. In some cases, the display is integrated with a touch and/or force sensor in order to detect touches and/or forces applied along an exterior surface of the device 900.

The electronic device 900 may also include a communication port 912 that is configured to transmit and/or receive signals or electrical communication from an external or separate device. The communication port 912 may be configured to couple to an external device via a cable, adaptor, or other type of electrical connector. In some embodiments, the communication port 912 may be used to couple the electronic device 900 to a host computer.

The electronic device 900 may also include at least one accessory 916, such as a camera, a flash for the camera, or other such device. The camera may be part of a camera assembly which may be connected to other parts of the electronic device 900 such as the control circuitry 910.

As used herein, the terms "about," "approximately," "substantially," "similar," and the like are used to account for relatively small variations, such as a variation of +/−10%, +/−5%, +/−2%, or +/−1%. In addition, use of the term "about" in reference to the endpoint of a range may signify a variation of +/−10%, +/−5%, +/−2%, or +/−1% of the endpoint value. In addition, disclosure of a range in which at least one endpoint is described as being "about" a specified value includes disclosure of the range in which the endpoint is equal to the specified value.

The following discussion applies to the electronic devices described herein to the extent that these devices may be used to obtain personally identifiable information data. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. A mobile phone comprising:
   a display;
   a camera assembly comprising an array of camera modules; and
   an enclosure enclosing the display and the camera assembly, the enclosure comprising:
      a housing component;
      a front cover assembly coupled to the housing component and positioned over the display; and
      a rear cover assembly coupled to the housing component and comprising a glass cover member defining:
         a protrusion defining a raised surface region having a texture with a first gloss value;
         an array of openings formed in the raised surface region and extending through a thickness of the glass cover member, each camera module of the array of camera modules extending at least partially through a respective opening of the array of openings; and
         a base surface region at least partially surrounding the protrusion, offset with respect to the raised surface region, and having a second gloss value greater than the first gloss value.

2. The mobile phone of claim 1, wherein:
   the glass cover member defines a substantial entirety of a rear surface of the mobile phone;
   the rear cover assembly comprises a color layer comprising a polymer with a pigment dispersed within the polymer;
   the color layer is disposed along an inner surface of the glass cover member;
   the first gloss value ranges from 10 gloss units to 45 gloss units as measured at 60 degrees; and
   the second gloss value is at least 10% greater than the first gloss value.

3. The mobile phone of claim 2, wherein:
   the texture of the raised surface region has:
      a root mean square height from 0.2 microns to 2 microns; and
      a root mean square slope from 0.1 to less than 1.25; and
   the base surface region has a root mean square height less than the root mean square height of the texture of the raised surface region.

4. The mobile phone of claim 2, wherein:
   the camera assembly further includes an illumination module; and
   the illumination module is positioned to transmit light through an opening of the array of openings.

5. The mobile phone of claim 2, wherein the camera assembly is coupled to an interior surface of the rear cover assembly.

6. The mobile phone of claim 1, wherein the raised surface region is offset from the base surface region by a distance ranging from 0.5 mm to 1.5 mm.

7. The mobile phone of claim 1, wherein each camera module of the array of camera modules is provided with a respective cover window.

8. An electronic device comprising:
   an enclosure including a cover assembly comprising:
      a front cover assembly defining a front surface of the electronic device; and
      a rear cover assembly defining a rear surface of the electronic device, the rear cover assembly comprising:
         a glass member comprising:
            a first portion defining an array of through-holes, a first thickness, and a textured exterior surface region, the first portion having a first transmissive haze value; and
            a second portion at least partially surrounding the first portion, defining a second thickness, less than the first thickness, and having a second transmissive haze value that is less than the first transmissive haze value; and
         a coating disposed along an interior surface of the glass member and including a color layer; and
   a camera assembly coupled to an interior surface of the cover assembly and including an array of optical modules, each optical module of the array of optical modules extending into a respective through-hole of the array of through-holes.

9. The electronic device of claim 8, wherein:
   the array of optical modules includes at least one camera module; and
   an end of the at least one camera module is proud of the textured exterior surface region.

10. The electronic device of claim 8, wherein:
    the first transmissive haze value is greater than or equal to 50%; and
    the second transmissive haze value is less than 30%.

11. The electronic device of claim 8, wherein the second portion of the glass member is transparent to visible light.

12. The electronic device of claim 8, wherein:
    the textured exterior surface region has a root mean square height from 0.2 microns to 2 microns; and
    an exterior surface region of the second portion has a root mean square height from 1 nm to 125 nm.

13. The electronic device of claim 12, wherein the textured exterior surface region has a root mean square slope from 0.1 to 1.

14. The electronic device of claim 8, further comprising a display, wherein the front cover assembly is positioned over the display.

15. An electronic device comprising:
    an enclosure comprising:
       a front cover formed from a first glass material and defining a front surface of the electronic device; and
       a rear cover formed from a second glass material and defining a rear surface of the electronic device, the rear cover including a cover member formed from glass and comprising:
          a first portion including a protrusion defining a first surface region and an opening extending from the first surface region to an interior surface of the first portion, the first surface region having a first gloss value from 15 gloss units to 45 gloss units as measured at 60 degrees; and
          a second portion at least partially surrounding the first portion and defining a second surface region having a second gloss value greater than the first gloss value; and
    a camera assembly at least partially positioned within the enclosure and comprising an optical module extending into the opening.

16. The electronic device of claim 15, wherein:
    the protrusion defines an array of openings; and
    the camera assembly includes an array of optical modules, each optical module of the array of optical modules extending into a respective opening of the array of openings.

17. The electronic device of claim 15, wherein a texture of the first surface region has a root mean square height from 0.2 microns to 2 microns and an autocorrelation length from 2 microns to 30 microns.

18. The electronic device of claim 17, wherein the texture of the first surface region has a mean peak curvature ranging from 0.5 microns to 2 microns.

19. The electronic device of claim 15, wherein the protrusion defines a plateau.

20. The electronic device of claim 15, wherein the electronic device is a mobile phone.

* * * * *